(12) United States Patent
Yen et al.

(10) Patent No.: US 10,680,609 B2
(45) Date of Patent: Jun. 9, 2020

(54) MULTIPLEXER CIRCUIT, AND METHOD AND SYSTEM FOR GENERATING LAYOUT DIAGRAM CORRESPONDING TO SAME

(71) Applicant: TAIWAN SEMICONDUCTOR MANUFACTURING COMPANY, LTD., Hsinchu (TW)

(72) Inventors: Yang-Chi Yen, Hsinchu (TW); Bo-Ting Chen, Fengyuan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/416,871

(22) Filed: May 20, 2019

(65) Prior Publication Data
US 2019/0273495 A1 Sep. 5, 2019

Related U.S. Application Data

(63) Continuation of application No. 15/902,880, filed on Feb. 22, 2018, now Pat. No. 10,298,228.

(60) Provisional application No. 62/505,835, filed on May 12, 2017.

(51) Int. Cl.
*H03K 17/693* (2006.01)
*H03K 19/173* (2006.01)
(Continued)

(52) U.S. Cl.
CPC .......... *H03K 17/693* (2013.01); *G06F 1/26* (2013.01); *G06F 1/263* (2013.01); *H01L 27/092* (2013.01);
(Continued)

(58) Field of Classification Search
None
See application file for complete search history.

(56) References Cited

U.S. PATENT DOCUMENTS 5,157,291 A 10/1992 Shimoda
6,040,718 A * 3/2000 Henry .................. H03K 5/24
327/407

(Continued)

FOREIGN PATENT DOCUMENTS

JP 3200132 8/2001
JP 2009-544182 12/2009
(Continued)

OTHER PUBLICATIONS

Notice of Allowance dated Jan. 14, 2019 from corresponding application No. TW 107112932.
(Continued)

*Primary Examiner* — Jeffery S Zweizig
(74) *Attorney, Agent, or Firm* — Hauptman Ham, LLP

(57) ABSTRACT

A multiplexer circuit, of power supply (PS) voltages, includes: finger circuits correspond to the PS voltages, each selectable finger circuit (A) having an input node which is finger-circuit-specific and an output node which is common to the finger circuits, (B) including an anti-leak transistor of a first conductivity (C1) type, a selector transistor and a driver transistor transistors of a second conductivity (C2) type connected in series between the input node and the output node, and (C) being configured to receive a corresponding one of the PS voltages from the input node, and provide, if selected, a first version of the corresponding PS voltage to the output node.

20 Claims, 18 Drawing Sheets

(51) Int. Cl.
  *H01L 27/118*  (2006.01)
  *H01L 27/092*  (2006.01)
  *H04J 1/02*  (2006.01)
  *G06F 1/26*  (2006.01)

(52) U.S. Cl.
  CPC ...... *H01L 27/11898* (2013.01); *H03K 19/173* (2013.01); *H04J 1/02* (2013.01)

(56) References Cited

U.S. PATENT DOCUMENTS

| | | |
|---|---|---|
| 7,298,181 B2 | 11/2007 | Khan et al. |
| 8,129,862 B2 | 3/2012 | Audy |
| 8,963,614 B2 | 2/2015 | Lee |
| 8,994,440 B2 | 5/2015 | Ryu |
| 9,306,552 B1 | 4/2016 | Brennan et al. |
| 2011/0063047 A1 | 3/2011 | Okuda |

FOREIGN PATENT DOCUMENTS

| | | |
|---|---|---|
| KR | 10-2006-0130883 | 12/2006 |
| KR | 10-2010-0020896 | 2/2010 |
| TW | 201505151 | 2/2015 |

OTHER PUBLICATIONS

Notice of Allowance dated Sep. 20, 2019 and English translation from corresponding application No. KR 10-2018-0054415.

\* cited by examiner

FIG. 3C

| Finger 304B(0) not selected | | | Finger 304B(1) not selected | | | Finger 304B(2) not selected | | | Finger 304B(3) selected | | |
|---|---|---|---|---|---|---|---|---|---|---|---|
| transistor T(i,j) | state | CTRL_gated(i) | transistor T(i,j) | state | CTRL_gated(i) | transistor T(i,j) | state | CTRL_gated(i) | transistor T(i,j) | state | CTRL_gated(i) |
| N11 | off | 0 | N12 | off | 0 | N13 | off | 0 | N14 | on | VDDmax |
| P21 | off | VDDmax | P22 | off | VDDmax | P23 | off | VDDmax | P24 | on | 0 |
| P31 | off | $V_{bias\_rail}$=VDD4 | P32 | off | $V_{bias\_rail}$=VDD4 | P33 | off | $V_{bias\_rail}$=VDD4 | P34 | on | 0 |

FIG. 3D

| Finger 304B(0) selected | | | Finger 304B(1) not selected | | | Finger 304B(2) not selected | | | Finger 304B(3) not selected | | |
|---|---|---|---|---|---|---|---|---|---|---|---|
| transistor T(i,j) | state | CTRL_gated(i) | transistor T(i,j) | state | CTRL_gated(i) | transistor T(i,j) | state | CTRL_gated(i) | transistor T(i,j) | state | CTRL_gated(i) |
| N11 | on | VDDmax | N12 | off | 0 | N13 | off | 0 | N14 | off | 0 |
| P21 | on | 0 | P22 | off | VDDmax | P23 | off | VDDmax | P24 | off | VDDmax |
| P31 | on | 0 | P32 | off | $V_{bias\_rail}$=VDD1 | P33 | off | $V_{bias\_rail}$=VDD1 | P34 | off | $V_{bias\_rail}$=VDD1 |

FIG. 3E

| Finger 304B(0) not selected | | | Finger 304B(1) selected | | | Finger 304B(2) not selected | | | Finger 304B(3) not selected | | |
|---|---|---|---|---|---|---|---|---|---|---|---|
| transistor T(i,i) | state | $CTRL_{gate(i)}$ | transistor T(i,i) | state | $CTRL_{gate(i)}$ | transistor T(i,i) | state | $CTRL_{gate(i)}$ | transistor T(i,i) | state | $CTRL_{gate(i)}$ |
| N11 | off | 0 | N12 | on | VDDmax | N13 | off | 0 | N14 | off | 0 |
| P21 | off | VDDmax | P22 | on | 0 | P23 | off | VDDmax | P24 | off | VDDmax |
| P31 | off | $V_{bias\_rail}$ =VDD2 | P32 | on | 0 | P33 | off | $V_{bias\_rail}$ =VDD2 | P34 | off | $V_{bias\_rail}$ =VDD2 |

FIG. 3F

| Finger 304B(0) not selected | | | Finger 304B(1) not selected | | | Finger 304B(2) selected | | | Finger 304B(3) not selected | | |
|---|---|---|---|---|---|---|---|---|---|---|---|
| transistor T(i,i) | state | $CTRL_{gate(i)}$ | transistor T(i,i) | state | $CTRL_{gate(i)}$ | transistor T(i,i) | state | $CTRL_{gate(i)}$ | transistor T(i,i) | state | $CTRL_{gate(i)}$ |
| N11 | off | 0 | N12 | off | 0 | N13 | on | VDDmax | N14 | off | 0 |
| P21 | off | VDDmax | P22 | off | VDDmax | P23 | on | 0 | P24 | off | VDDmax |
| P31 | off | $V_{bias\_rail}$ =VDD3 | P32 | off | $V_{bias\_rail}$ =VDD3 | P33 | on | 0 | P34 | off | $V_{bias\_rail}$ =VDD3 |

…

MULTIPLEXER CIRCUIT, AND METHOD AND SYSTEM FOR GENERATING LAYOUT DIAGRAM CORRESPONDING TO SAME

PRIORITY CLAIM

The present application is a continuation of U.S. application Ser. No. 14/220,751, filed Mar. 20, 2014, now U.S. Pat. No. 10,402,529, granted Sep. 3, 2019, which is incorporated herein by reference in its entirety.

BACKGROUND

While the reduction of power consumption has long been a goal in the design of semiconductor devices, more recently the expansion of mobile computing/electronics has increased the attention paid to this goal. For systems comprised of discrete components mounted to a printed circuit board (PCB), power consumption is reducible by operating different components at different voltage levels and/or frequencies. For a system-on-chip (SoC), power islands (or voltage islands) are used as a technique for reducing power consumption, where the power islands represent corresponding power domains, some or all of which operate at different voltage levels and/or frequencies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3C-3F are corresponding tables of control signals generated by the selection logic of FIG. 3B, in accordance with at least one embodiment of the present disclosure.

DETAILED DESCRIPTION

Figure 1:
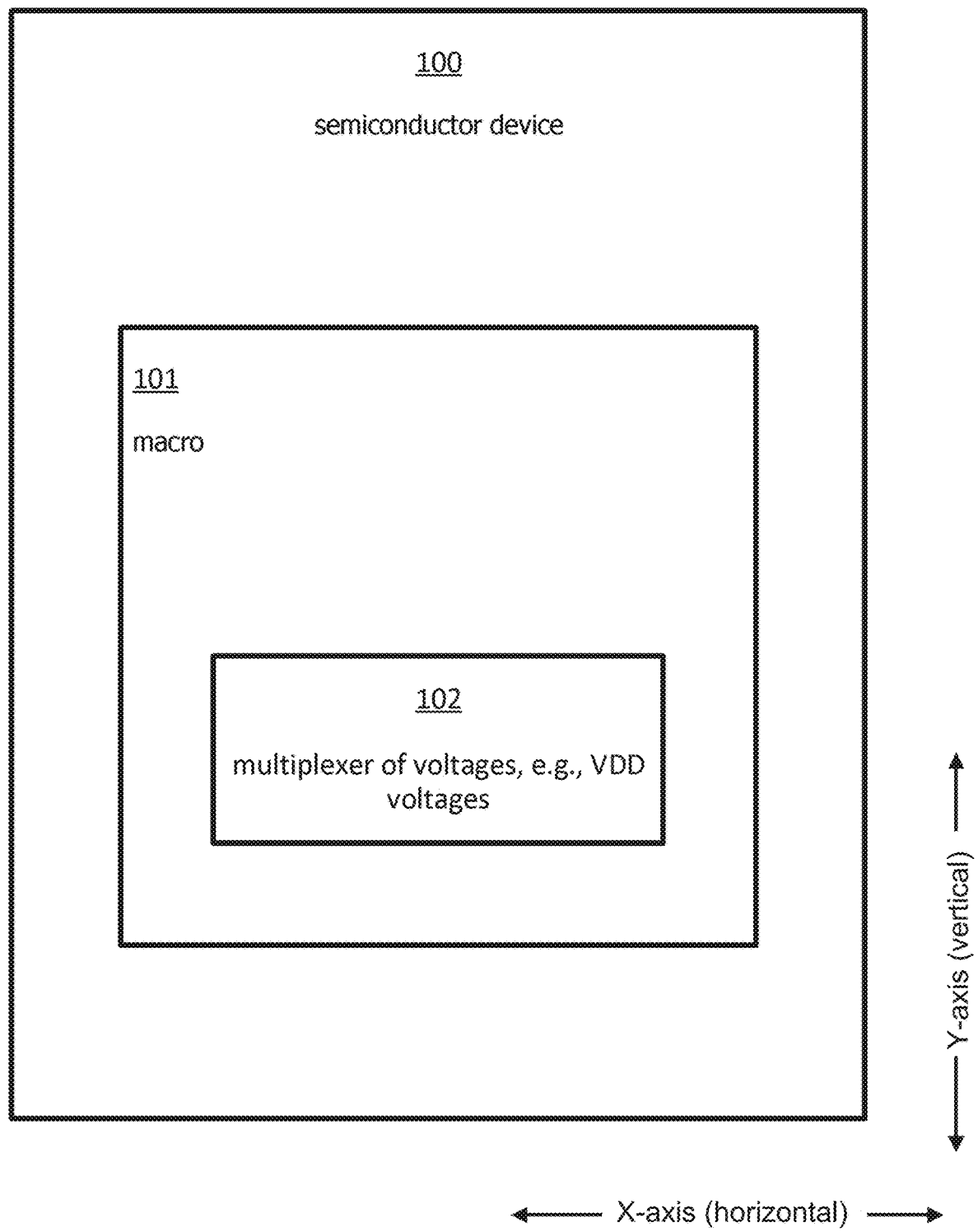
FIG. 1 is a block diagram of a semiconductor device, in accordance with at least one embodiment of the present disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a multiplexer of power supply (PS) voltages is provided which includes selectable finger circuits corresponding to the PS voltages, wherein each of the selectable finger circuits includes an anti-leak transistor, a selector transistor and a driver transistor. In some embodiments, the anti-leak transistor is an NMOS transistor. In the non-selected finger circuits, if instead the NMOS transistor was not present, then the selector and driver transistors would behave as forward-biased diodes and represent leakage paths between (A) the bodies of the selector and driver transistors and (B) the corresponding PS voltages. An advantage of the anti-leak transistor (NMOS transistor) is that such leakage paths are reduced, if not prevented. In some embodiments, the anti-leak transistor is a native NMOS transistor. An advantage of the anti-leak transistor being a native transistor (native NMOS transistor) in at least some embodiments is that the voltage drop across the anti-leak transistor is small, if not negligible, which improves the current capability of the corresponding finger circuit. In some embodiments, the bodies of the selector and driver transistors are biased to the selected one of the PS voltages. If the bodies of the selector and driver transistors instead were biased to the largest one of the PS (PSmax) voltages, then some or all of the 'other' finger circuits (which are used to select ones of the PS voltages other than the largest PS voltage) would exhibit poor current driving capability if selected because the bodies of the selector and driver transistors in the 'other' finger circuits would be biased with the PSmax voltage which would be larger than corresponding received PS voltages, thereby inducing at least some of the selector and driver transistors to operate in the corresponding cutoff regions. Accordingly in at least some embodiments, an advantage of biasing the bodies of the selector and driver transistors to the selected one of the PS voltages is that none of the selector and driver transistors is induced to operate in the corresponding cutoff regions.

FIG. 1 is a block diagram of a semiconductor device 100, in accordance with at least one embodiment of the present disclosure.

In FIG. 1, semiconductor device 100 includes, among other things, a circuit macro/module (hereinafter, macro) 101. In some embodiments, macro 101 is system-on-chip (SOC) macro. Macro 101 includes a multiplexer circuit 102, where multiplexer circuit 102 is configured to multiplex voltages. In some embodiments, multiplexer circuit 102 is configured to multiplex different power supply voltages (see items 202A of FIG. 2A, 202B of FIG. 2B, or the like, discussed below).

In some embodiments, macro 101 is understood in the context of an analogy to the architectural hierarchy of modular programming in which subroutines/procedures are called by a main program (or by other subroutines) to carry out a given computational function. In this context, semiconductor device 100 uses macro 101 to perform one or more given functions. Accordingly, in this context and in terms of architectural hierarchy, semiconductor device 100 is analogous to the main program and macro (hereinafter, macro) 101 is analogous to subroutines/procedures. In some embodiments, macro 101 is a soft macro. In some embodiments, macro 101 is a hard macro. In some embodiments, macro 101 is a soft macro which is described/couched in register-transfer level (RTL) code. In some embodiments, synthesis, placement and routing have yet to have been performed on macro 101 such that the soft macro can be synthesized, placed and routed for a variety of process nodes. In some embodiments, macro 101 is a hard macro which is described/couched in a binary file format (e.g., Graphic Database System II (GDSII) stream format), where the binary file format represents planar geometric shapes, text labels, other information and the like of one or more layout diagrams of macro 101 in hierarchical form. In some embodiments, synthesis, placement and routing have been performed on macro 101 such that the hard macro is specific to a particular process node.

Figure 2A:
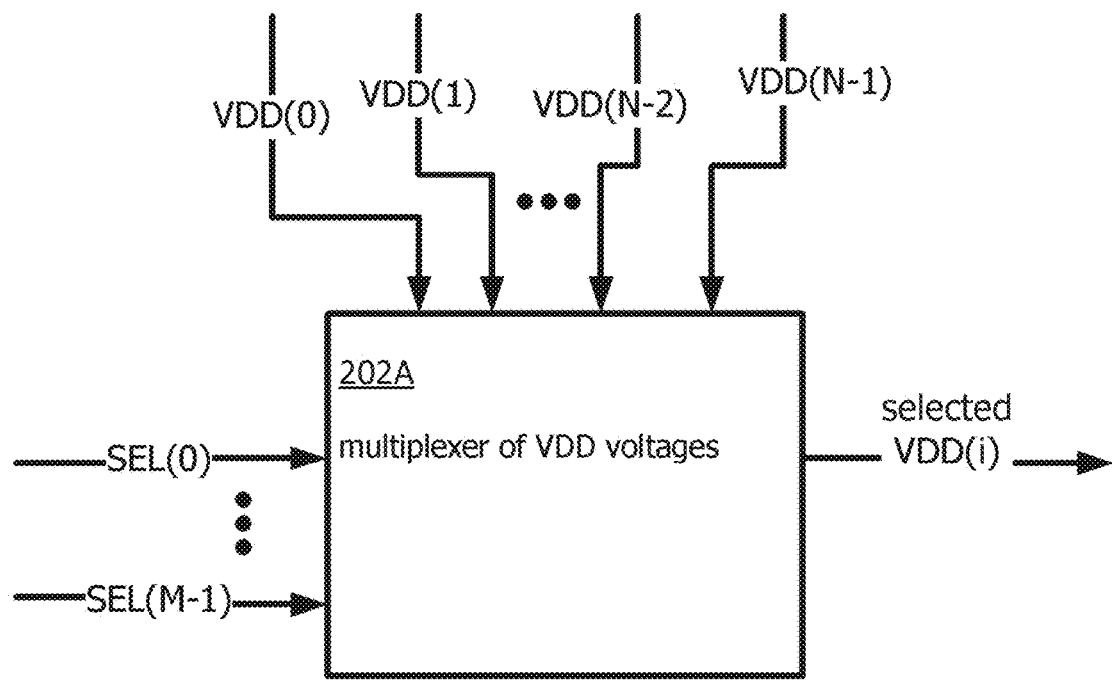
FIG. 2A is a block diagram of multiplexer circuit, in accordance with at least one embodiment of the present disclosure.

FIG. 2A is a block diagram of a multiplexer circuit 202A of voltages, in accordance with at least one embodiment of the present disclosure. In some embodiments, multiplexer circuit 202A is an example of multiplexer circuit 102 of FIG. 1.

In FIG. 2A, multiplexer circuit 202A is configured to select one amongst N different voltages and output the selected one of the N voltages, where N is an integer and N≥2. More particularly, multiplexer circuit 202A is configured to: receive N voltages VDD(0), VDD(1), . . . , VDD(N−2) and VDD(N−1), and M control signals SEL(0), . . . , SEL(M−1), where M is an integer and M≥1; select one amongst voltages VDD(0)-VDD(N−1) according to control signals SEL(0)-SEL(M−1); and output the selected voltage VDD(i), where i is an integer corresponding to the selected one of the integers 0, 1, . . . , N−2 and N−1. While FIG. 2A shows at least two controls signals, in some embodiments, M=1 such that there is one control signal SEL.

In FIG. 2A, voltages VDD(0)-VDD(N−1) represent power supply voltages. In some embodiments, voltages VDD(0)-VDD(N−1) represent power supply voltages which correspond to different SOC macros. In some embodiments, voltages VDD(0)-VDD(N−1) represent voltages other than power supply voltages.

Figure 2B:
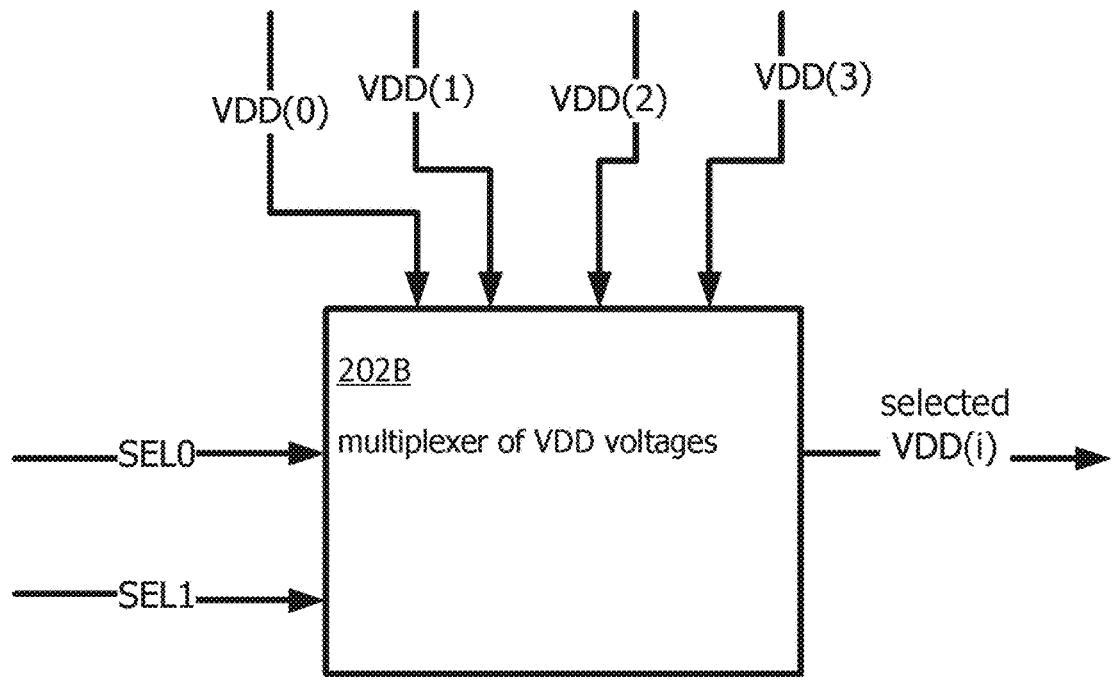
FIG. 2B is a block diagram of multiplexer circuit, in accordance with at least one embodiment of the present disclosure.

FIG. 2B is a block diagram of a multiplexer circuit 202B of voltages, in accordance with at least one embodiment of the present disclosure. In some embodiments, multiplexer circuit 202B is an example of multiplexer circuit 102 of FIG. 1.

Multiplexer circuit 202B of FIG. 2B is an implementation of multiplexer circuit 202A of FIG. 2A where, for simplicity of explanation, M=2 and N=4. Accordingly, multiplexer circuit 202B is configured to: receive four (N=4) voltages VDD(0), VDD(1), VDD(2) and VDD(3), and two (M=2) control signals SEL(0) and SEL(1); select one amongst voltages VDD(0)-VDD(3) according to control signals SEL(0)-SEL(1); and output the selected voltage VDD(i), where VDD(i) equals the selected one of voltages VDD(0)-VDD(3).

Figure 3A:
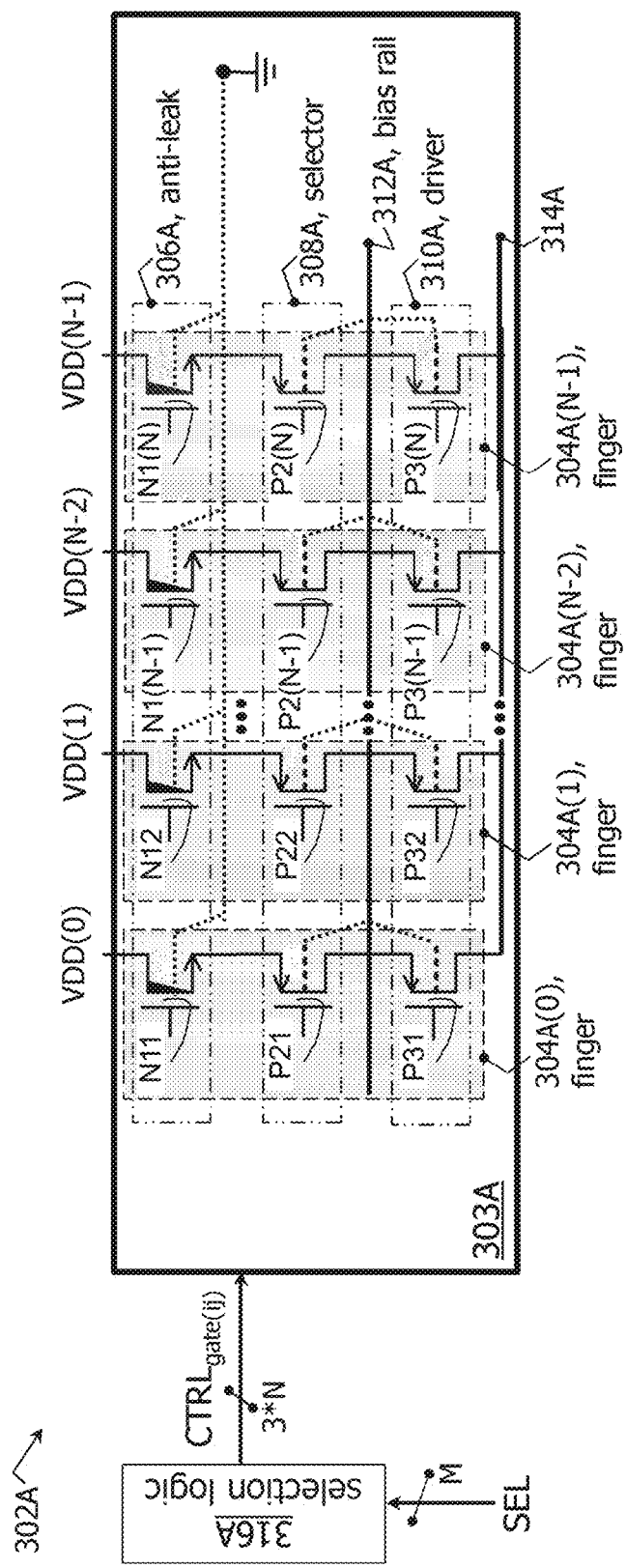
FIG. 3A is a circuit diagram of multiplexer circuit, in accordance with at least one embodiment of the present disclosure.

FIG. 3A is a circuit diagram of a multiplexer circuit 302A of voltages, in accordance with at least one embodiment of the present disclosure. In some embodiments, multiplexer circuit 302A is an example of multiplexer circuit 102 of FIG. 1. In some embodiments, multiplexer circuit 302A is an example of multiplexer circuit 202A of FIG. 2A.

In FIG. 3A, multiplexer circuit 302A is configured to select one amongst N different voltages and output the selected one of the N voltages, where N is an integer and N>2. More particularly, multiplexer circuit 302A is configured to: receive N voltages VDD(0), VDD(1), . . . , VDD(N−2) and VDD(N−1), and M control signals SEL(0), . . . , SEL(M−1), where M is an integer and M≥1; select one amongst voltages VDD(0)-VDD(N−1) according to control signals SEL(0)-SEL(M−1); and output the selected voltage VDD(i), where i is an integer corresponding to the selected one of the integers 0, 1, . . . , N−2 and N−1. In some embodiments, M=1 such that there is one control signal SEL.

Multiplexer circuit 302A includes: a transistor network 303A; a bias rail 312A; an output node 314A; and selection logic 316A. Transistor network 303A includes selectable finger circuits 304A(0), 304A(1), . . . , 304A(N−2) and 304A(N−1) which are configured to receive corresponding voltages VDD(0), VDD(1), . . . , VDD(N−2) and VDD(N−1).

Each of finger circuits 304A(0), 304A(1), . . . , 304A(N−2) and 304A(N−1) includes three serially connected transistors. Finger circuit 304A(0) includes serially connected NMOS transistor N11, PMOS transistor P21 and PMOS transistor P31. Finger circuit 304A(1) includes serially connected transistors N12, P22 and P32. Finger circuit 304A(N−2) includes serially connected transistors N1(N−1), P2(N−1) and P3(N−1). Finger circuit 304A(N−1) includes serially connected transistors N1(N), P2(N) and P3(N). In some embodiments, each of finger circuits 304A(0), 304A(1), . . . , 304A(N−2) and 304A(N−1) includes more than three serially connected transistors.

NMOS transistors N11, N12, . . . , N1(N−1) and N1(N) are: non-enhancement NMOS transistors; and comprise a group 306A of anti-leak transistors. In some embodiments, transistors N11, N12, . . . , N1(N−1) and N1(N) are instead non-enhancement mode PMOS transistors P11, P12, . . . , P1(N−1) and P1(N).

In some embodiments, group 306A of non-enhancement mode anti-leak transistors is comprised of native NMOS transistors. A native transistor is a transistor which has undergone little, if any, channel doping, and consequently the body (or bulk) of the transistor determines the conductivity characteristics of the channel and thereby sets the threshold voltage. In the context of NMOS transistors, the native NMOS transistor exhibits a threshold voltage lower than a non-native NMOS transistor. In some embodiments, the threshold voltage of the native NMOS transistor is around zero volts.

In some embodiments, group 306A of non-enhancement mode anti-leak transistors is comprised of depletion mode transistors. For MOSFET technology, there exists an intermediate region between the source and drain regions of a transistor. A depletion mode transistor is a 'normally-ON' transistor because a conductive path (a channel) through the intermediate region is formed during fabrication of the transfer such that the channel exists by default. During fabrication of the depletion mode transistor, the intermediate region is implanted and/or diffused with a sufficiently high/large concentration of dopant such that the channel exists by default, hence the depletion mode transistor is regarded as 'normally-ON.' Accordingly, voltage is applied selectively to the gate electrode of a depletion mode transistor in order to repel charge carriers from the intermediate region, which selectively albeit temporarily destroys the channel and thereby selectively turns OFF the depletion mode transistor.

In the context of NMOS transistors: when a small voltage volts) is applied to the gate electrode, the channel through the intermediate region remains in existence such that the depletion mode NMOS transistor remains ON; and when a negative voltage is applied to the gate electrode, the channel through the intermediate region is destroyed such that the depletion mode NMOS transistor is OFF. In the context of PMOS transistors: when a large voltage (VDD volts) is applied to the gate electrode, the channel through the intermediate region remains in existence such that the depletion mode PMOS transistor remains ON; and when a very large voltage (>>VDD) is applied to the gate electrode, the channel through the intermediate region is destroyed such that the depletion mode PMOS transistor is OFF.

PMOS transistors P21, P22, . . . , P2(N−1) and P2(N) are: enhancement-mode transistors; and comprise a group 308A of selector transistors. PMOS transistors P31, P32, . . . , P3(N−1) and P3(N) comprise a group 310A of driver transistors. In some embodiments, transistors P21, P22, . . . , P2(N−1) and P2(N) and P31, P32, . . . , P3(N−1) and P3(N) are instead corresponding enhancement mode NMOS transistors N21, N22, . . . , N2(N−1) and N2(N) and N31, N32, . . . , N3(N−1) and N3(N).

Regarding enhancement mode, for MOSFET technology, again, there exists an intermediate region between the source and drain regions of a transistor. An enhancement mode transistor is a 'normally-OFF' transistor because a conductive path (a channel) through the intermediate region is not formed during fabrication of the transfer such that the channel does not exist by default and such that the enhancement mode transistor is turned off by default. To turn on the enhancement mode transistor, voltage is applied selectively to the gate electrode in order to attract charge carriers to the intermediate region, which selectively albeit temporarily creates/forms the channel and thereby selectively turns ON the enhancement mode transistor.

In the context of NMOS transistors: when a voltage less than the threshold voltage Vt is applied to the gate electrode, no channel is induced through the intermediate region such that the enhancement mode NMOS transistor remains OFF; and when a voltage equal to or greater than the threshold voltage Vt is applied to the gate electrode, the channel is induced through the intermediate region such that the enhancement mode NMOS transistor is turned ON. In the context of PMOS transistors: when a voltage greater than the threshold voltage Vt is applied to the gate electrode, no channel is induced through the intermediate region such that the enhancement mode PMOS transistor remains OFF; and when a voltage equal to or less than the threshold voltage Vt is applied to the gate electrode, the channel is induced through the intermediate region such that the enhancement mode PMOS transistor is turned ON.

Selection logic 316A of FIG. 3A is configured to receive the M control signals SEL(0), . . . , SEL(M−1), and to generate 3*N control signals $CTRL_{gate(ij)}$ which are output to gate electrodes of corresponding transistors N11, N12, . . . , N1(N−1), N1(N), P21, P22, . . . , P2(N−1), P2(N), P31, P32, . . . , P3(N−1) and P3(N) of transistor network 303A. Transistor network is organized as an array of rows and columns such that, e.g., the transistor at the intersection of row 1 and column 1 is N11, the transistor at the intersection of row 2 and column 2 is P22, or the like. Accordingly, selection logic 316A is configured to generate: control signal $CTRL_{gate(11)}$ and output the same to transistor N11; control signal $CTRL_{gate(22)}$ and output the same to transistor P22; or the like. More detail regarding selection logic 316A is provided below in the discussion of selection logic 316B of FIG. 3B and the related discussion of FIGS. 3C-3F. In some embodiments, where each of finger circuits 304A(0), 304(1), . . . , 304A(N−2) and 304A(N−1) includes more than three serially connected transistors, then selection logic 316A generates and outputs correspondingly more than 3*N control signals $CTRL_{gate(ij)}$. In some embodiments, if each of finger circuits 304A(0), 304A(1), . . . , 304A(N−2) and 304A(N−1) includes four serially connected transistors, then selection logic 316A generates and outputs correspondingly more than 4*N control signals $CTRL_{gate(ij)}$.

Figure 3B:
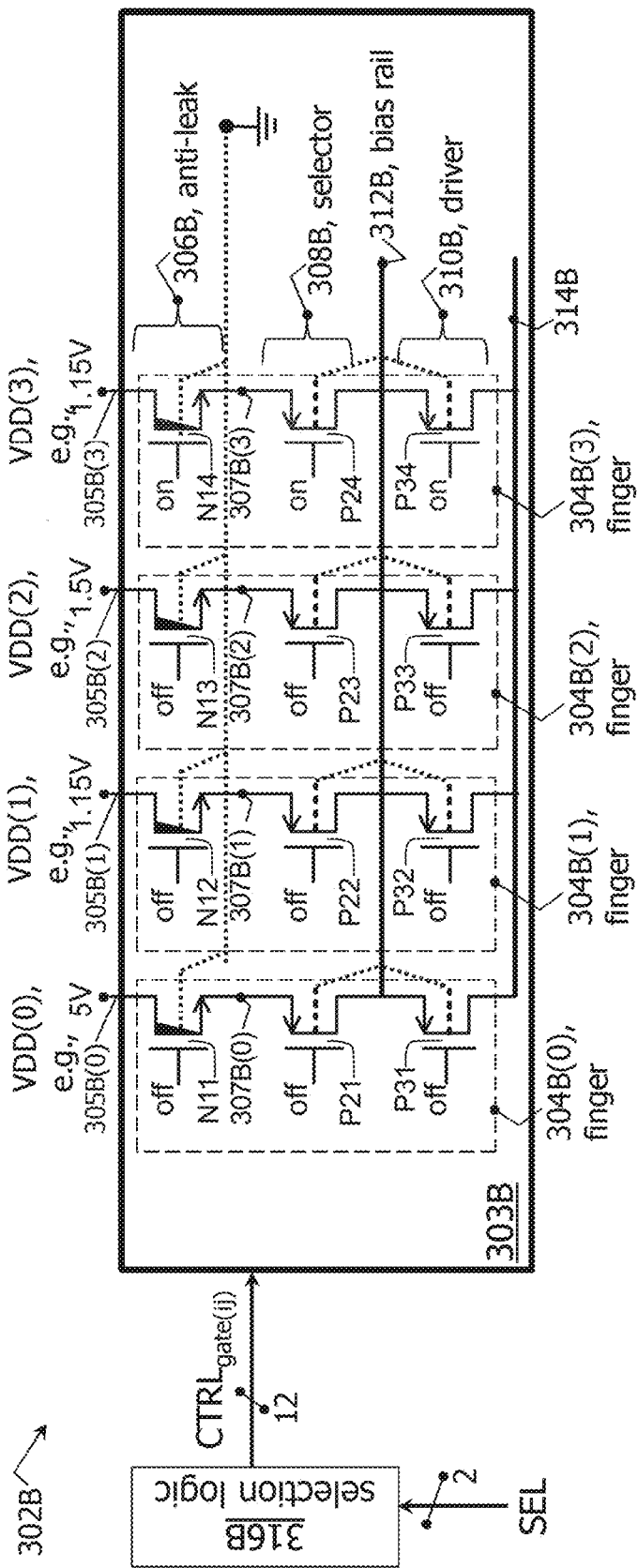
FIG. 3B is a circuit diagram of multiplexer circuit, in accordance with at least one embodiment of the present disclosure.

FIG. 3B is a circuit diagram of a multiplexer circuit 302B of voltages, in accordance with at least one embodiment of the present disclosure. In some embodiments, multiplexer circuit 302B is an example of multiplexer circuit 102 of FIG. 1. In some embodiments, multiplexer circuit 302B is an example of multiplexer circuit 202B of FIG. 2B.

Multiplexer circuit 302B of FIG. 3B is an implementation of multiplexer circuit 302A of FIG. 3A where, for simplicity of explanation, M=2 and N=4. Accordingly, multiplexer circuit 302B is configured to: receive four (N=4) voltages VDD(0), VDD(1), VDD(2) and VDD(3), and two (M=2) control signals SEL(0) and SEL(1); select one amongst voltages VDD(0)-VDD(3) according to control signals SEL(0)-SEL(1); and output the selected voltage VDD(i), where VDD(i) equals the selected one of voltages VDD(0)-VDD(3). Also, selection logic 316B is configured to generate twelve control signals $CTRL_{gate(ij)}$, as discussed in more detail below regarding FIGS. 3C-3F. In some embodiments, selection logic 316B is configured to generate a positive number of control signals other than twelve control signals.

Each of selectable finger circuits 304A(0), 304A(1), 304A(2) and 304A(3) of transistor network 303B has a finger-circuit-specific input node by which to receive corresponding voltages VDD(0), VDD(1), VDD(2) and VDD(3). An output node 314B is common to each of selectable finger circuits 304A(0), 304A(1), 304A(2) and 304A(3). In FIG. 3B, VDD(0)=5V, VDD(1)=1.15V, VDD(2)=1.5V and VDD(3)=1.15V. In some embodiments, one of more of VDD(0)-VDD(3) represent voltages other than the corresponding voltages shown in FIG. 3B.

Regarding finger circuit 304B(0), native transistor N11 is connected between voltage VDD(0) and a node 307B(0). Transistor P21 is connected between node 307B(0) and a node which represents bias rail 312B. Transistor P31 is connected between bias rail 312B and output node 314B. Regarding finger circuit 304B(1), native transistor N12 is connected between voltage VDD(1) and a node 307B(1). Transistor P22 is connected between node 307B(1) and a node which represents bias rail 312B. Transistor P32 is connected between bias rail 312B and output node 314B. Regarding finger circuit 304B(2), native transistor N13 is connected between voltage VDD(2) and a node 307B(2). Transistor P23 is connected between node 307B(2) and a node which represents bias rail 312B. Transistor P33 is connected between bias rail 312B and output node 314B. Regarding finger circuit 304B(3), native transistor N14 is connected between voltage VDD(2) and a node 307B(2). Transistor P23 is connected between node 307B(2) and a node which represents bias rail 312B. Transistor P33 is connected between bias rail 312B and output node 314B.

In FIG. 3B, the bodies of transistors P21-P24 and P31-P34 are biased to the voltage on bias rail 312B. In some embodiments, the bodies of transistors P21-P24 and P31-P34 are biased to a voltage other than the voltage on bias rail 312B. In FIG. 3B, the bodies of transistors N11-N14 are biased to VSS. In some embodiments, the bodies of transistors N11-N14 are biased to a voltage other than VSS.

FIG. 3B assumes a circumstance in which finger circuit 304B(3) has been selected such that selection logic 316B controls the transistors of finger circuit 304B(3) to be turned on while the transistors of finger circuits 304B(0)-304B(2) are turned off.

FIG. 3C is a table of control signals $CTRL_{gate(ij)}$ generated by selection logic 316B, in accordance with at least one embodiment of the present disclosure.

The table of FIG. 3C assumes that finger circuit 304B(3) has been selected. As such, selection logic 316B generates control signals $CTRL_{gate(11)}$-$CTRL_{gate(34)}$ and provides the same to the gate electrodes of corresponding transistors N11-N14, P21-P24 and P31-P34 so as to turn on transistors N14, P24 and P34, and turn off transistors N11-N13, P21-P23 and P31-P33 as follows. In some embodiments, selection logic 316B is implemented with a combination (not shown) of one or more NAND circuits, one or more NOR circuits and one or more inverters.

To turn on the transistors of finger circuit 304B(3), selection logic 316B generates control signals as follows: Control signal $CTRL_{gate(14)}$ is set equal to the largest one of voltages VDD(0)-VDD(3), and is provided to the gate electrode of transistor N14, thereby turning on transistor N14. In some embodiments, a design rule mandates that the largest voltage be assigned to VDD(0). In FIG. 3B, VDD(0) is assumed to be the largest one of voltages VDD(0)-VDD(3). In some embodiments, one of voltages VDD(0)-VDD(3) other than VDD(0) will be the largest voltage. Control signal $CTRL_{gate(24)}$ is set equal to zero volts, and is provided to the gate electrode of transistor P24, thereby turning on transistor P24. Control signal $CTRL_{gate(34)}$ is set equal to zero volts, and is provided to the gate electrode of transistor P34, thereby turning on transistor P34.

To turn off the transistors of finger circuits 304B(0)-304B(2), selection logic 316B generates control signals as follows: Control signals $CTRL_{gate(11)}$, $CTRL_{gate(12)}$ and $CTRL_{gate(13)}$ are set equal to zero volts, and are provided to the gate electrodes of corresponding transistors N11, N12 and N13, thereby turning off transistors N11, N12 and N13. NMOS transistors are leaky, e.g., even if the gate voltage is 0V. For example, if finger circuit 304B(0) is provided with VDD(1)=1.15V, node 307B(0) may be higher than 1.15V since native transistor N11 is leaky and transistor P21 is turned on. With the understanding that native NMOS transistors are leaky, control signals $CTRL_{gate(21)}$, $CTRL_{gate(22)}$ and $CTRL_{gate(23)}$ are set equal to the largest one of voltages VDD(0)-VDD(3), and are provided to the gate electrodes of corresponding transistors P21, P22 and P23, thereby turning off transistors P21, P22 and P23 Control signals $CTRL_{gate(31)}$, $CTRL_{gate(32)}$ and $CTRL_{gate}(33)$ are set equal to the voltage on bias rail 312B, and are provided to the gate electrodes of transistors P31, P32 and P33, thereby turning off transistors P31, P32 and P33. Because FIG. 3B assumes the circumstance in which finger 304B(3) has been selected, the voltage on bias rail 312B is VDD(3).

FIG. 3D is a table of control signals $CTRL_{gate(ij)}$ generated by selection logic 316B, in accordance with at least one embodiment of the present disclosure.

The table of FIG. 3D is similar to the table of FIG. 3C except that the table of FIG. 3C assumes that finger circuit 304B(0) has been selected. For the sake of brevity, no further discussion of FIG. 3D is provided.

FIG. 3E is a table of control signals $CTRL_{gate(ij)}$ generated by selection logic 316B, in accordance with at least one embodiment of the present disclosure.

The table of FIG. 3E is similar to the table of FIG. 3C except that the table of FIG. 3E assumes that finger circuit 304B(1) has been selected. For the sake of brevity, no further discussion of FIG. 3E is provided.

FIG. 3F is a table of control signals $CTRL_{gate(ij)}$ generated by selection logic 316B, in accordance with at least one embodiment of the present disclosure.

The table of FIG. 3F is similar to the table of FIG. 3C except that the table of FIG. 3F assumes that finger circuit 304B(2) has been selected. For the sake of brevity, no further discussion of FIG. 3F is provided.

Returning to the discussion of FIG. 3B, if anti-leak transistors 306B were not present but instead source terminals of transistors P21-P24 were connected directly to corresponding voltages VDD(0)-VDD(3), the non-selected ones of transistors P21-P24 (in the non-selected ones of finger circuits 304B(0)-304B(3)) would behave as forward-biased diodes and represent leakage paths between voltages VDD(0)-VDD(3) and the bodies of corresponding non-selected finger circuits. Accordingly, an advantage of anti-leak transistors 306B, namely transistors N11-N14, is that they reduce, if not prevent, such leakage paths. If anti-leak transistors 306B were implemented as non-native NMOS transistors rather than native NMOS transistors, then there would be a significant voltage drop across a given one of the non-native NMOS transistors, which would lessen the current capability of the corresponding finger circuit. Accordingly, an advantage of anti-leak transistors 306B, namely transistors N11-N14, being native NMOS transistors is that the voltage drop across transistors N11-N14 is small, if not negligible, which improves the current capability of the corresponding finger circuits 304B(0)-304B(3).

In FIG. 3B, if the bodies of transistors P21-P24 and P31-P34 were biased to the largest one of voltages VDD(0)-VDD(3), then finger circuits 304B(1) and 304B(3) would exhibit poor current driving capability if selected. Recalling that FIG. 3B assumes VDD(0)=5V, VDD(1)=1.15V and VDD(3)=1.15V, biasing the bodies of transistors P22 & P32 and P24 & P34 to VDD(0)=5V would induce transistors P22 & P32 and P24 & P34 to operate in their corresponding cutoff regions. Accordingly, an advantage of biasing the bodies of transistors P21-P24 and P31-P34 to the voltage on bias rail 312B is that none of transistors P21-P24 and P31-P34 is induced to operate in their corresponding cutoff regions.

Figure 4A:
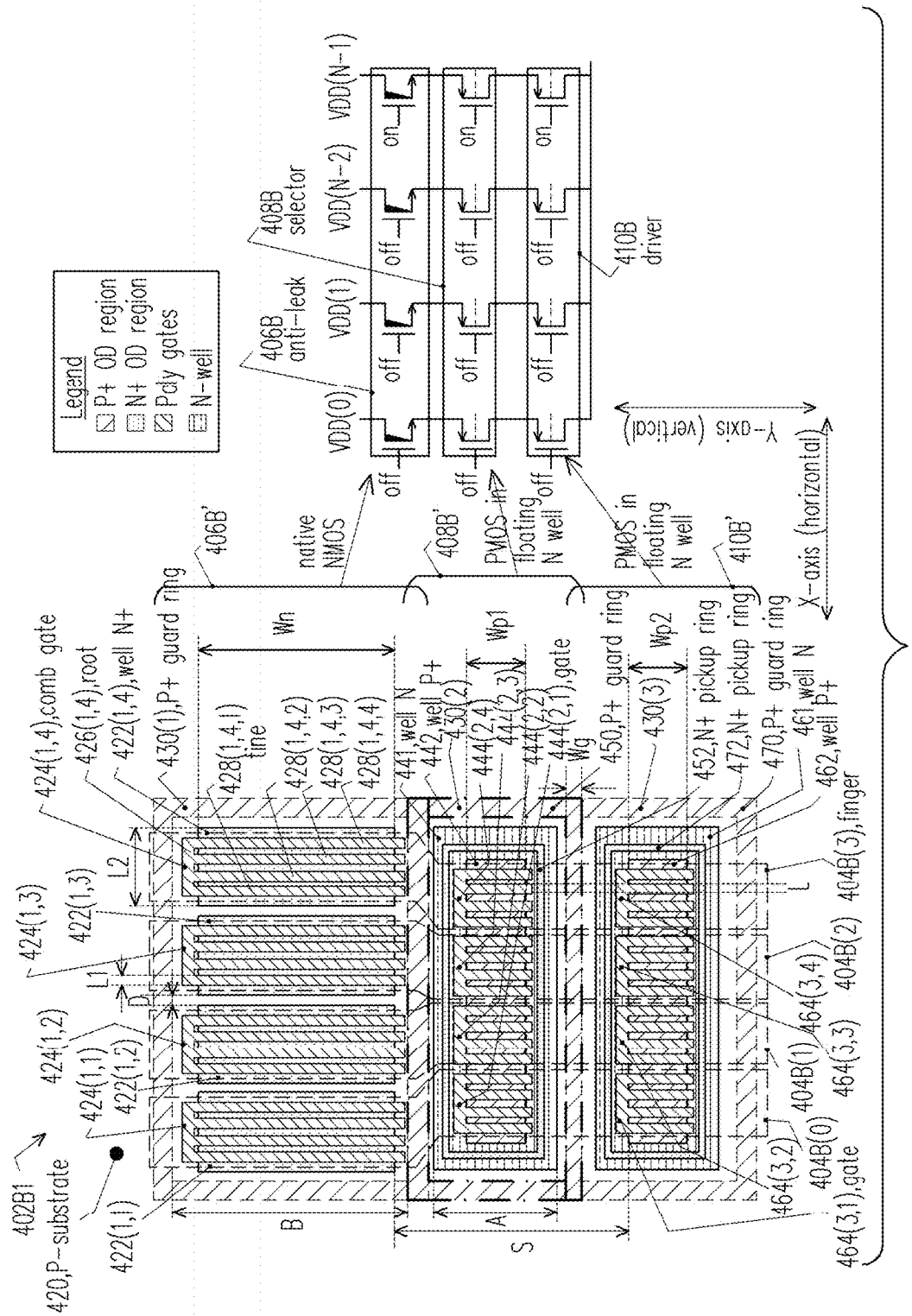
FIG. 4A is a layout diagram of a multiplexer circuit for multiplexing voltages, in accordance with at least one embodiment of the present disclosure.

FIG. 4A is a layout diagram 402B1 of a multiplexer circuit for multiplexing voltages, in accordance with at least one embodiment of the present disclosure. In some embodiments, an example of a multiplexer circuit resulting from layout diagram 402B1 is multiplexer circuit 102 of FIG. 1. In some embodiments, an example of a multiplexer circuit resulting from layout diagram 402B1 is multiplexer circuit 202B of FIG. 2B. In some embodiments, an example of a multiplexer circuit resulting from layout diagram 402B1 is multiplexer circuit 302B of FIG. 3B such that M=2 and N=4. In some embodiments, where more generally N is an integer, N≥2, M is an integer and M≥1, an example of a multiplexer circuit resulting from layout diagram 402B1 is multiplexer circuit 302A of FIG. 3A. The skilled artisan would understand layout diagram 402B1 as a substitute for a series of cross-sectional diagrams of a multiplexer circuit resulting from layout diagram 402B1.

In FIG. 4A, layout diagram 402B1 includes a substrate pattern 420, an anti-leak area pattern 406B', a selector area pattern 408B' and a driver area pattern 410B'. An example of anti-leak transistors resulting from anti-leak area pattern 406B' are anti-leak transistors 406B, where anti-leak transistors 406B correspond to anti-leak transistors 306B' of FIG. 3B. An example of selector transistors resulting from selector area 408B' are selection transistors 406B, where selection transistors 406B correspond to selector transistors 306B of FIG. 3B. An example of driver transistors resulting from driver area pattern 410B' are driver transistors 410B, where driver transistors 410B correspond to driver transistors 310B of FIG. 3B. In FIG. 4A, substrate pattern 420 is shown as having P-type conductivity.

Anti-leak area pattern 406B' is configured for depletion mode MOSFETs, and includes the following. Region patterns 422(1,1), 422(1,2), 422(1,3) and 422(1,4) are formed in substrate 420, are active regions, and are shown as having N-type conductivity in FIG. 4A. In some embodiments, region patterns 422(1,1), 422(1,2), 422(1,3) and 422(1,4) have borders defined by an insulating material, e.g., an oxide. In FIG. 4A, long axes of region patterns 422(1,1), 422(1,2), 422(1,3) and 422(1,4) are parallel to the vertical direction. More particularly, region patterns 422(1,1), 422(1,2), 422(1,3) and 422(1,4) are shown as having a higher dopant concentration than larger well 441 (discussed below) so as to be N+. Gate electrode patterns 424(1,1), 424(1,2), 424(1,3) and 424(1,4) are formed correspondingly on region patterns 422(1,1), 422(1,2), 422(1,3) and 422(1,4), and define corresponding native NMOS transistor patterns. Examples of native NMOS transistors resulting from the native NMOS transistor patterns defined by gate electrode patterns 424(1,1), 424(1,2), 424(1,3) and 424(1,4) are corresponding transistors N11, N12, N13 and N14 of FIG. 3B. When considering region patterns 422(1,1), 422(1,2), 422(1,3) and 422(1,4) as representing a group, a ring pattern 430(1) is formed outside a periphery of the group, has P-type conductivity, and has a higher dopant concentration than substrate 420 so as to be P+ in order to serve as a guard ring which improves resistance to latch up.

In FIG. 4A, each of gate electrode patterns 424(1,1), 424(1,2), 424(1,3) and 424(1,4) has a fork/comb shape. For example, gate electrode pattern 424(1,4) includes a root pattern 426(1,4) from which extend tine patterns 428(1,4,1), 428(1,4,2), 428(1,4,3) and 428(1,4,4) such that tine patterns 428(1,4,1), 428(1,4,2), 428(1,4,3) and 428(1,4,4) are electrically connected together by a root pattern 426(1,4). In FIG. 4A, a long axis of root pattern 426(1,4) is parallel to the horizontal direction and long axes of tine patterns 428(1,4,1), 428(1,4,2), 428(1,4,3) and 428(1,4,4) are parallel to the vertical direction. In some embodiments, each of gate electrode patterns 424(1,1), 424(1,2), 424(1,3) and 424(1,4) has a fork/comb shape which includes a number of tine patterns other than 4. In some embodiments, each of gate electrode patterns 424(1,1), 424(1,2), 424(1,3) and 424(1,4) has a shape other than a fork/comb shape. In some embodiments, each of gate electrode patterns 424(1,1), 424(1,2), 424(1,3) and 424(1,4) includes one or more tine patterns but does not include a root pattern connecting the tine patterns.

Selector area pattern 408B' is configured for enhancement mode MOSFETs, and includes the following. A larger well pattern 441 is formed in substrate 420, has N-type conductivity, and has a smaller dopant concentration than ring 452 (discussed below), and is larger than smaller well pattern 442 (discussed below). A smaller well pattern 442 is formed in larger well pattern 441, has P-type conductivity, and has a higher dopant concentration than substrate 420 so as to be P+, and is smaller than larger well 421. In FIG. 4A, a long axis of each of larger well pattern 441 and smaller well pattern 442 is parallel to the horizontal direction. Gate electrode patterns 444(2,1), 444(2,2), 444(2,3) and 444(2,4) are formed on smaller well pattern 442, and define corresponding PMOS transistor patterns. Examples of PMOS transistors resulting from the PMOS transistor patterns defined by gate electrode patterns 444(2,1), 444(2,2), 444(2,3) and 444(2,4) are corresponding transistors P21, P22, P23 and P24 of FIG. 3B. Each of gate electrode patterns 444(2,1), 444(2,2), 444(2,3) and 444(2,4) has a fork/comb shape similar to the fork/comb shape of gate electrode patterns 424(1,1), 424(1,2), 424(1,3) and 424(1,4). It is noted, however, that the tines of gate electrode patterns 444(2,1), 444(2,2), 444(2,3) and 444(2,4) are significantly shorter (in the vertical direction of FIG. 4A) than the corresponding tines of gate electrode patterns 424(1,1), 424(1,2), 424(1,3) and 424(1,4). In some embodiments, each of gate electrode patterns 444(2,1), 444(2,2), 444(2,3) and 444(2,4) has a fork/comb shape which includes a number of tine patterns other than 4. In some embodiments, each of gate electrode patterns 444(2,1), 444(2,2), 444(2,3) and 444(2,4) has a shape other than a fork/comb shape. In some embodiments, each of gate electrode patterns 444(2,1), 444(2,2), 444(2,3) and 444(2,4) includes one or more tine patterns but does not include a root pattern connecting the tine patterns. A ring pattern 452 is formed around a periphery of smaller well pattern 441 and within a periphery of larger well 442, has N-type conductivity, and has a higher dopant concentration than larger well 441 so as to be N+ in order to serve as a pickup ring, which improves resistance to latch up. Ring pattern 430(2) is formed outside a periphery of larger well pattern 441, has P-type conductivity, and has a higher dopant concentration than substrate 420 so as to be P+ in order to serve as a guard ring. A side of ring pattern 430(2) is shared with ring pattern 430(1).

Driver area pattern 410B' is configured for enhancement mode MOSFETs, and includes the following. A larger well pattern 461 is formed in substrate 420, has N-type conductivity, and has a smaller dopant concentration than ring 472 (discussed below), and is larger than smaller well pattern 462 (discussed below). A smaller well pattern 462 is formed in larger well pattern 461, has P-type conductivity, and has a higher dopant concentration than substrate 420 so as to be P+. In FIG. 4A, a long axis of each of larger well pattern 461 and smaller well pattern 462 is parallel to the horizontal direction. Gate electrode patterns 464(3,1), 464(3,2), 464(3,3) and 464(3,4) are formed on smaller well pattern 442, and define corresponding PMOS transistor patterns. Examples of PMOS transistors resulting from the PMOS transistor patterns defined by gate electrode patterns 464(3,1), 464(3,2), 464(3,3) and 464(3,4) are corresponding transistors P31, P32, P33 and P34 of FIG. 3B. Each of gate electrode patterns 464(3,1), 464(3,2), 464(3,3) and 464(3,4) has a fork/comb shape similar to the fork/comb shape of gate electrode patterns 424(1,1), 424(1,2), 424(1,3) and 424(1,4). It is noted, however, that the tines of gate electrode patterns 464(3,1), 464(3,2), 464(3,3) and 464(3,4) are significantly shorter (in the vertical direction of FIG. 4A) than the corresponding tines of gate electrode patterns 424(1,1), 424(1,2), 424(1,3) and 424(1,4). In some embodiments, each of gate electrode patterns 464(3,1), 464(3,2), 464(3,3) and 464(3,4) has a fork/comb shape which includes a number of tine patterns other than 4. In some embodiments, each of gate electrode patterns 464(3,1), 464(3,2), 464(3,3) and 464(3,4) has a shape other than a fork/comb shape. In some embodiments, each of gate electrode patterns 464(3,1), 464(3,2), 464(3,3) and 464(3,4) includes one or more tine patterns but does not include a root pattern connecting the tine patterns. A ring pattern 472 is formed around a periphery of smaller well pattern 461 and within a periphery of larger well 462, has N-type conductivity, and has a higher dopant concentration than larger well 461 so as to be N+ in order to serve as a guard ring. Ring pattern 430(3) is formed outside a periphery of larger well pattern 461, has P-type conductivity, and has a higher dopant concentration than substrate 420 so as to be P+ in order to serve as a guard ring. A side of ring pattern 430(3) is shared with ring pattern 430(2).

Layout diagram 402B1 is organized into selectable finger circuit patterns 404B(0), 404B(1), 404B(2) and 404B(3). Examples of finger circuits resulting from finger circuit patterns 404B(0), 404B(1), 404B(2) and 404B(3) are corresponding finger circuits 304B(0), 304B(1), 304B(2) and 304B(3) of FIG. 3B. Recalling that the transistors of a finger circuit are serially connected, e.g., such as in any one of finger circuits 304B(0), 304B(1), 304B(2) and 304B(3) of FIG. 3B, layout diagram 402B1 includes conductor patterns (not shown) which serially connect the transistor patterns of corresponding finger circuit patterns 404B(0), 404B(1), 404B(2) and 404B(3).

In FIG. 4A, if smaller well pattern 442 was instead implemented as four yet-smaller well 'patternettes' 442(0)-442(3) (not shown) corresponding to gate electrode patterns 444(2,1)-444(2,4), the resultant selector area 408B" (not shown) would have a larger footprint than a footprint of selector area 408B', e.g., because of isolation/insulation regions being disposed between 'patternettes' 442(0)-442(3). Accordingly, an advantage of using smaller well pattern 442 rather than four yet-smaller well 'patternettes' 442(0)-442(3) (again, not shown) is that the footprint of selector area 408B' is smaller than the selector area 408B" (again, not shown), which results in a smaller footprint for layout diagram 402B1.

Also in FIG. 4A, if smaller well pattern 462 was instead implemented as four yet-smaller well 'patternettes' 462(0)-462(3) (not shown) corresponding to gate electrode patterns 464(2,1)-464(2,4), the resultant driver area 410B" (not shown) would have a larger footprint than a footprint of driver area 410B', e.g., because of isolation/insulation regions being disposed between 'patternettes' 462(0)-462(3). Accordingly, an advantage of using smaller well pattern 462 rather than four yet-smaller well 'patternettes' 462(0)-462(3) (again, not shown) is that the footprint of selector area 410B' is smaller than the footprint of selector area 410B" (again, not shown), which results in a smaller footprint for layout diagram 402B1.

Regarding a MOSFET transistor which has a fork/comb shape gate electrode (including a number of tine patterns connected together by a root pattern), and for a given one of the tines, a portion of the given tine which overlaps the underlying active area pattern defines a 'channelette.' A benefit of using a MOSFET transistor which has a fork/comb shape gate electrode is that an effective distance in the vertical direction of the channel is the sum of the distances of distances of each of the channelettes in the vertical direction. In some embodiments, due to the use of the fork/comb shape gate electrode, a channel distance $W_{CH}$ in the vertical direction of each of the transistor patterns of anti-leak area pattern 406B' is Q406B'*Wn, where Q406B' is the number of tine patterns in each of the transistor patterns of anti-leak area pattern 406B' and where Wn is the distance in the vertical direction of the channelettes corresponding to tine patterns, e.g., tine patterns 428(1,4,1), 428(1,4,2), 428(1,4,3) and 428(1,4,4) of gate electrode pattern 424(1,4). In FIG. 4A, Q406B'=4 such that $W_{CH}$ of each of the transistor patterns of anti-leak area pattern 406B' is 4*Wn. In some embodiments, a channel distance $W_{CH}$ of each of the transistor patterns of selector area pattern 408B' is Q408B'*Wp1, where Q408B' is the number of tine patterns in each of the transistor patterns of selector area pattern 408B' and Wp1 is the length in the vertical direction of the channelettes corresponding to the tine patterns. In FIG. 4A, Q408B'=4 such that $W_{CH}$ of each of the transistor patterns of selector area pattern 408B' is 4*Wp1. In some embodiments, a channel distance $W_{CH}$ of each of the transistor patterns of driver area pattern 410B' is Q410B'*Wp2, where Q410B' is the number of tine patterns in each of the transistor patterns of driver area pattern 410B' and Wp2 is the length in the vertical direction of the channelettes corresponding to the tine patterns. In FIG. 4A, Q410B'=4 such that $W_{CH}$ of each of the transistor patterns of selector area pattern 410B' is 4*Wp2.

In some embodiments, a channel distance $W_{CH}$ in the vertical direction of each of the transistor patterns of anti-leak area pattern 406B', selector area pattern 408B' and driver area pattern 410B' is $W_{CH} \geq (\approx 2.5*L1)$, where L1 is a distance in the horizontal direction of a tine of the gate electrode pattern. In some embodiments, $L1 \leq (\approx 2.5 \text{ μm})$. In some embodiments, where transistors P31-P34 represent a space S in the vertical direction of the anode of a silicon controlled rectifier (SCR) (not shown) is $S \geq (\approx 2.5*L1)$. In some embodiments, a distance Wg in the vertical direction of each of ring patterns 4030(1), 430(2) and 430(3) is $(\approx 0.2*L1) \leq Wg \leq ('\approx 7.5*L1)$. In some embodiments, $(\approx 0.4 \text{ um}) \leq Wg \leq (\approx 15 \text{ um})$.

In some embodiments, a ratio Wp1/A between a distance Wp1 in the vertical direction and a distance A in the vertical direction lies in a range, $(\approx 50\%) \leq (Wp1/A) \leq (\approx 90\%)$. In some embodiments, a ratio Wn/L2 between a distance Wn in the vertical direction and a distance L2 in the horizontal direction lies in a range, $(\approx 2) \leq (Wn/L2) \leq (\approx 20)$. In some embodiments, a ratio Wn/B between Wn and a distance B in the vertical direction lies in a range, $(\approx 50\%) \leq (Wn/B) \leq (\approx 95\%)$. In some embodiments, a space D in the horizontal direction between adjacent ones of region patterns 422(1,1), 422(1,2), 422(1,3) and 422(1,4) is $D \leq (\approx 2.5*L1)$. In some embodiments, $D \leq (\approx 5 \text{ μm})$.

Figure 4B:
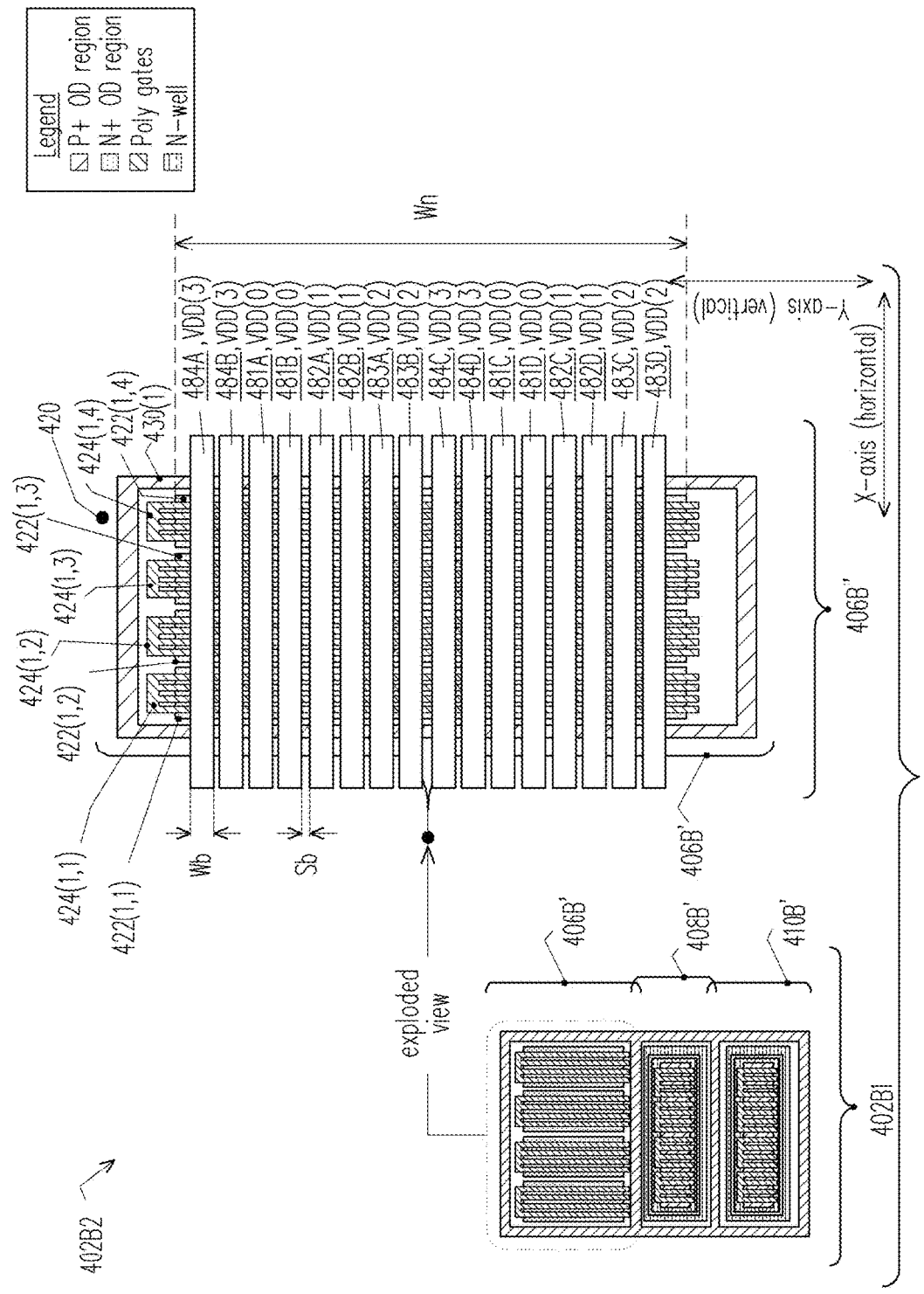
FIG. 4B is a layout diagram of a multiplexer circuit for multiplexing voltages, in accordance with at least one embodiment of the present disclosure.

FIG. 4B is a layout diagram 402B2 of a multiplexer circuit for multiplexing voltages, in accordance with at least one embodiment of the present disclosure. In some embodiments, an example of a multiplexer circuit resulting from layout diagram 402B2 is multiplexer circuit 102 of FIG. 1. In some embodiments, an example of a multiplexer circuit resulting from layout diagram 402B2 is multiplexer circuit 202B of FIG. 2B. In some embodiments, an example of a multiplexer circuit resulting from layout diagram 402B2 is multiplexer circuit 302B of FIG. 3B such that M=2 and N=4. In some embodiments, where more generally N is an integer, N≥2, M is an integer and M≥1, an example of a multiplexer circuit resulting from layout diagram 402B2 is multiplexer circuit 302A of FIG. 3A. The skilled artisan would understand layout diagram 402B2 as a substitute for a series of cross-sectional diagrams of a multiplexer circuit resulting from layout diagram 402B2.

Layout diagram 402B2 of FIG. 4B is similar to layout diagram 402B1 of FIG. 4A except that layout diagram 402B2 further includes conductor patterns 481A-481D, 482A-482D, 483A-483D and 484A-484D over anti-leak area pattern 406B', which results in an anti-leak area pattern 406B". As such, for simplicity of illustration, FIG. 4B shows anti-leak area pattern 406B" as an exploded view of anti-leak area pattern 406B' with conductor patterns 481A-481D, 482A-482D, 483A-483D and 484A-484D of metallization layer located over anti-leak area pattern 406B', resulting in anti-leak area pattern 406B". Long axes of conductor patterns 481A-481D, 482A-482D, 483A-483D and 484A-484D are parallel to the horizontal direction. Conductors resulting from conductor patterns 481A-481D provide voltage VDD (0).

In FIG. 4B, conductors resulting from conductor patterns 482A-482D provide voltage VDD(1). Conductors resulting from conductor patterns 483A-483D provide voltage VDD (2). Conductors resulting from conductor patterns 484A-484D provide voltage VDD(3). In FIG. 4B, conductor patterns 481A-481D, 482A-482D, 483A-483D and 484A-484D are arranged in a repeating sequence relative to the vertical direction so as to be evenly distributed above anti-leak area pattern 406B', where the sequence is: 484A, 484B, 481A, 481B, 482A, 482B, 483A and 483B. In some embodiments, conductor patterns 481A-481D, 482A-482D, 483A-483D and 484A-484D are arranged in a different sequence.

In some embodiments, a spacing Sb in the vertical direction lies in a range, $(\approx 0.25*L1) \leq Sb \leq (\approx 5*L1)$. In some embodiments, $(\approx 0.5 \text{ μm}) \leq Sb \leq (\approx 10 \text{ μm})$. In some embodiments, a distance Wb of each of conductor patterns 481A-481D, 482A-482D, 483A-483D and 484A-484D lies in a range, $(\approx 0.5*L1) \leq Wb \leq (\approx 12.5*L1)$. In some embodiments, $(\approx 1 \text{ μm}) \leq Wb \leq (\approx 25 \text{ μm})$. In some embodiments, a density ratio Wb/(Wb+Sb) of conductor patterns 481A-481D, 482A-482D, 483A-483D and 484A-484D lies in a range, $(\approx 50\%) \leq (Wb/(Wb+Sb)) \leq (\approx 85\%)$. In some embodiments, a coverage ratio (Wb*Z)/Wn of conductor patterns 481A-481D, 482A-482D, 483A-483D and 484A-484D lies in a range, $((Wb*Z)/Wn) > (\approx 50\%)$, where Z is a positive integer representing a count of conductor patterns 481A-481D, 482A-482D, 483A-483D and 484A-484D. Such ranges have advantages including enhancing metal utilization, reducing ESD bus resistance, or the like. In some embodiments, metal utilization improves by $\approx 30\%$. In some embodiments, ESD bus resistance is reduced by $\approx 10\%$.

Figure 5:
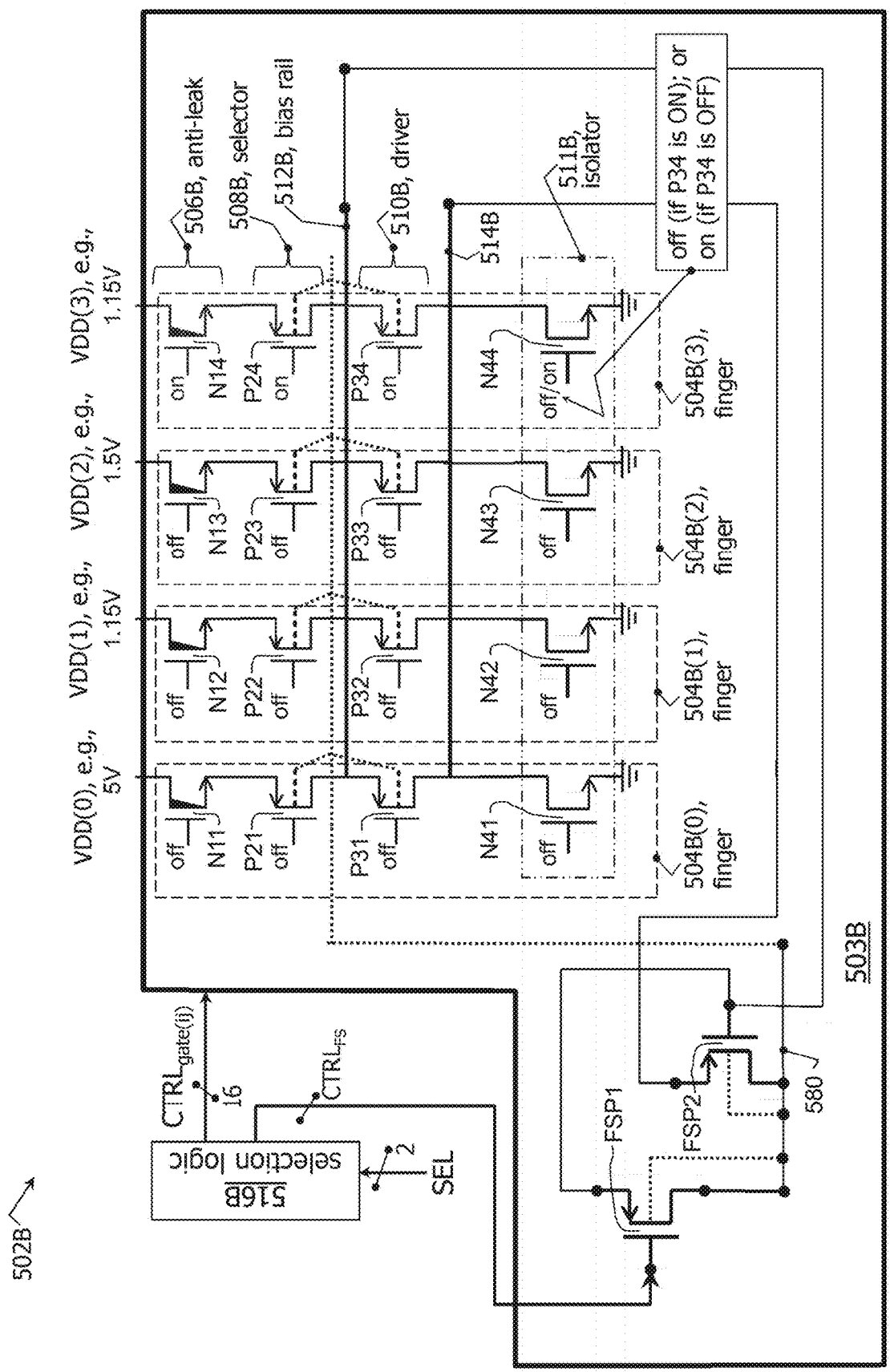
FIG. 5 is a circuit diagram of a multiplexer circuit, in accordance with at least one embodiment of the present disclosure.

FIG. 5 is a circuit diagram of a multiplexer circuit 502B of voltages, in accordance with at least one embodiment of the present disclosure. In some embodiments, multiplexer circuit 502B is an example of multiplexer circuit 102 of FIG. 1. In some embodiments, multiplexer circuit 502B is an example of multiplexer circuit 202B of FIG. 2B.

Multiplexer circuit 502B of FIG. 5 is an implementation of multiplexer circuit 502A (not shown, but which is similar to multiplexer circuit 302A of FIG. 3A) where, for simplicity of explanation, M=2 and N=4. Multiplexer circuit 502B is similar to multiplexer 302B of FIG. 3B, where such similarities are indicated by increasing the reference numbers in FIG. 5 by 200 relative to the reference numbers of corresponding elements in FIG. 3B. For the sake of brevity, the discussion of multiplexer 502B will focus on differences with respect to multiplexer 302B.

Multiplexer circuit 502B supports a failsafe mode of operation in addition to a normal mode of operation, where the normal mode of operation corresponds to the mode of operation of multiplexer circuit 302B of FIG. 3B. In a circumstance in which an external device (not shown) is connected to output node 514B, the failsafe mode of operation reduces (if not prevents) current leaking into multiplexer circuit 502B from the external source.

Multiplexer circuit 502B includes NMOS transistors N41, N42, N43 and N44, which comprise a group 511B of isolator transistors. Each of selectable finger circuits 504A(0), 504A (1), 504A(2) and 504A(3) of transistor network 503B includes a corresponding one of transistors N41, N42, N43 and N44.

Each of transistors N41, N42, N43 and N44 is connected between output node 514B and VSS. Selection logic 516B generates 16 control signals $CTRL_{gate\ (ij)}$. In FIG. 5, a gate electrode of each of transistors N41, N42, N43 and N44 receives a corresponding control signals $CTRL_{gate\ (ij)}$ from selection logic 516B. In FIG. 5, finger circuit 504B(3) is selected such that transistors N41-N43 are turned off, e.g., by supplying the gate electrodes with 0V. The ON/OFF state of transistors N44 depends on the ON/OFF state of transistor P34. If transistor P34 is ON, then transistor N44 is off, and output node 514B is pulled up to VDD(3). If transistor P34 is OFF, then transistor N44 is ON, and output node 514B is pulled down to 0V.

Transistor network 503B further includes failsafe PMOS transistors FSP1 and FSP2. Transistor FSP1 is connected between bias rail 512B and a node 580. Transistor FSP2 is connected between output node 514B and node 580. The bodies of transistors FSP1-FSP2, transistors P21-P24 and transistors P31-P34 are connected to node 580. A gate electrode of transistor FSP1 is configured to receive a control signal $CTRL_{FS}$ generated by selection logic 516B. A gate electrode of transistor FSP2 is configured to receive a signal on bias rail 512B.

In the normal mode of operation, control signal $CTRL_{FS}$ is configured to turn on transistor FSP1, which connects the bodies of transistors FSP1-FSP2, P21-P24 and P31-P34 to the voltage on bias rail 512B, with the voltage on bias rail 512B being the selected one of voltages VDD(0)-VDD(3). Also in the normal mode operation, transistor FSP2 'floats' because each of the source and drain terminals of transistor FSP2 are connected to the voltage on bias rail 512B.

In the failsafe mode of operation, control signal $CTRL_{FS}$ is configured to turn off transistor FSP1. Also in the failsafe mode operation, transistor FSP2 In the normal mode, voltage VDD(i) of the selected finger 504B(i) is present/ON such that bias rail 512B is at VDD(i) and transistor FSP2 is OFF. In the failsafe, voltage VDD(i) of the selected finger 504B(i) is not present/OFF such that bias rail 512B is at about zero volts and transistor FSP2 is ON.

Figure 6A:
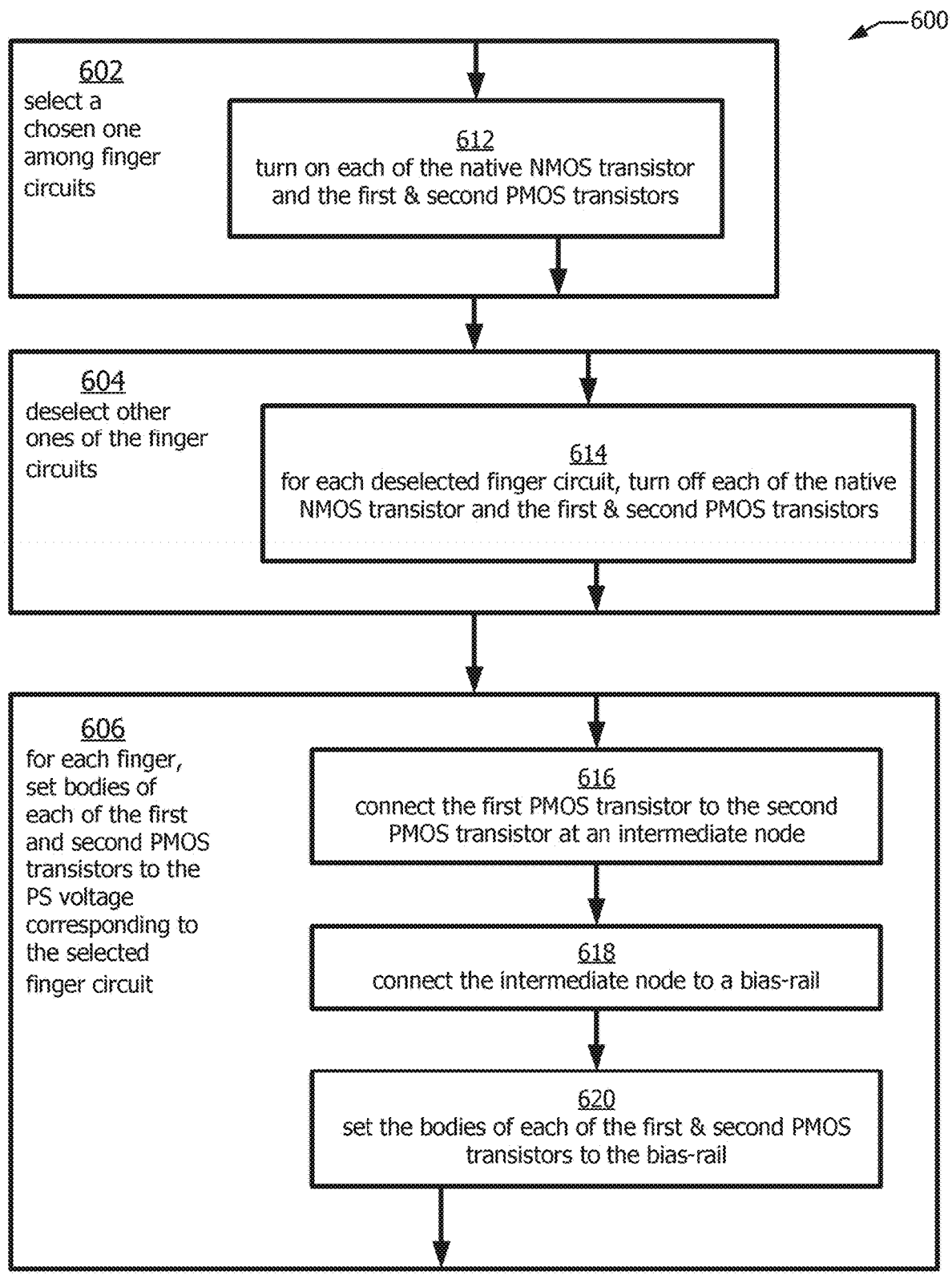
FIG. 6A is a flowchart of a method of multiplexing power supply (PS) voltages, in accordance with at least one embodiment of the present disclosure.

FIG. 6A is a flowchart of a method 600 of multiplexing power supply (PS) voltages, in accordance with at least one embodiment of the present disclosure.

Examples of a multiplexer circuit to which method 600 is applicable include multiplexer circuits 102 (FIG. 1), 202A (FIG. 2A), 202B (FIG. 2B), 302A (FIG. 3A), 302B (FIG. 3B) or 502B (FIG. 5), multiplexer circuits resulting from corresponding layout diagrams 402B1 (FIG. 4A) or 402B2 (FIG. 4B), or the like. Examples of the PS voltages include voltages VDD(0)-VDD(N−1) of FIGS. 2A and 3A, voltages VDD(0)-VDD(3) of FIGS. 2B, 3B and 5, or the like.

In FIG. 6A, method 600 includes blocks 602-606. At block 602, a chosen one of the finger circuits is selected. Examples of the finger circuits include fingers circuits 304A(0)-304A(N−1) of FIG. 3A, 304B(0)-304B(3) of FIG. 3B, 504B(0)-504B(3) of FIG. 5B, finger circuits resulting from finger circuit patterns 404B(0)-404B(3), or the like. Block 602 includes a block 612. At block 612, the chosen one of the finger circuits is selected by turning on each of the native NMOS transistor and the first and second PMOS transistors in the chosen one of the finger circuits. Examples of the native NMOS transistors include transistors N11-N14 of FIGS. 3B and 5B, transistors resulting from anti-leak area pattern 406B' of FIG. 4A, or the like. Examples of the first PMOS transistors include transistors P21-P24 of FIGS. 3B and 5B, transistors resulting from selector area pattern 408B' of FIG. 4A, or the like. Examples of the second PMOS transistors include transistors P31-P34 of FIGS. 3B and 5B, transistors resulting from driver area pattern 410B' of FIG. 4A, or the like. From block 612, flow exits block 602 and proceeds to block 604.

At block 604, the other ones of the finger circuits are deselected. Block 604 includes a block 614. At block 614, each of the other ones of the finger circuits is deselected by turning off each of the native NMOS transistor and the first and second PMOS transistors in each of the other ones of the finger circuits. From block 614, flow exits block 604 and proceeds to block 606.

At block 606, for each finger circuit, the bodies of each of the first PMOS transistor and the second PMOS transistor are connected to the PS voltage corresponding to the selected finger circuit. Block 606 includes blocks 616-620. At block 616, the first PMOS transistor is connected to the second PMOS transistor at an intermediate node. From block 616, flow proceeds to block 618. At block 618, the intermediate node is connected to a bias rail. An example of the intermediate node is the node represented by bias bar 312B of FIG. 3B. From block 318, flow proceeds to block 320. At block 320, the bodies of each of the first PMOS transistor and the second PMOS transistor to the bias rail. From block 620, flow exits block 606.

Figure 6B:
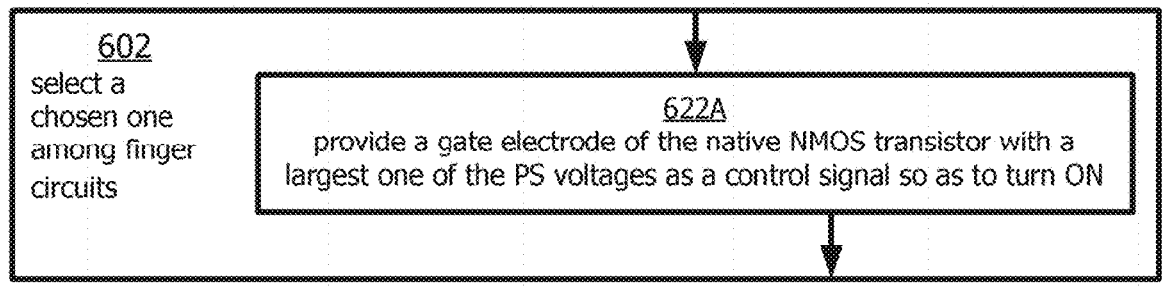
FIG. 6B is a flowchart describing a block of FIG. 6A in more detail, in accordance with at least one embodiment of the present disclosure.

FIG. 6B is a flowchart describing block 602 of FIG. 6A in more detail, in accordance with at least one embodiment of the present disclosure.

In FIG. 6B, block 602 includes a block 622A. At block 622A, for the chosen one of the finger circuits, a gate electrode of the native NMOS transistor is provided with a largest one of the PS voltages as a control signal so as to turn ON.

Figure 6C:
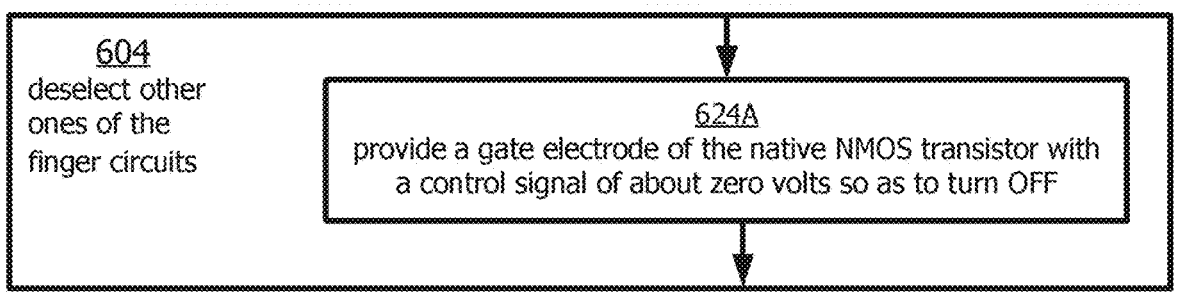
FIG. 6C is a flowchart describing a block of FIG. 6A in more detail, in accordance with at least one embodiment of the present disclosure.

FIG. 6C is a flowchart describing block 604 of FIG. 6A in more detail, in accordance with at least one embodiment of the present disclosure.

In FIG. 6C, block 604 includes a block 624A. At block 624A, for each of the other ones of the finger circuits, a gate electrode of the native NMOS transistor is provided with a control signal of about zero volts so as to turn OFF.

Figure 6D:
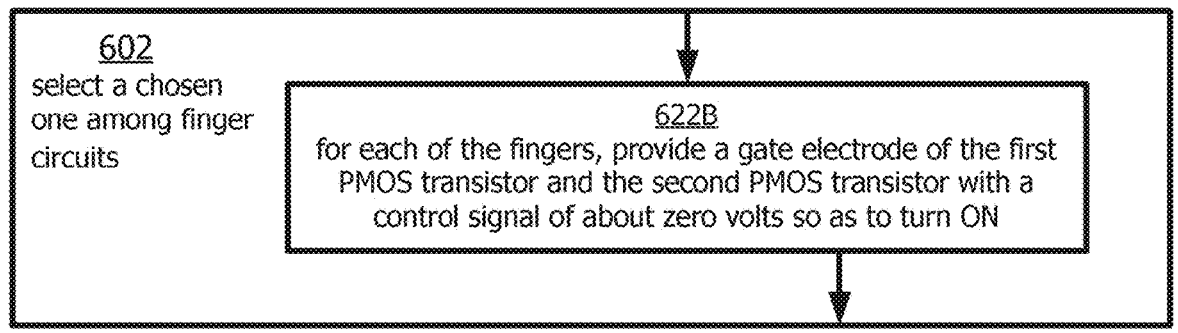
FIG. 6D is a flowchart describing a block of FIG. 6A in more detail, in accordance with at least one embodiment of the present disclosure.

FIG. 6D is a flowchart describing block 602 of FIG. 6A in more detail, in accordance with at least one embodiment of the present disclosure.

In FIG. 6D, block 602 includes a block 622B. At block 622B, for the chosen one of the finger circuits, a gate electrode of the first PMOS transistor and the second PMOS transistor is provided with a control signal of about zero volts so as to turn ON.

Figure 6E:
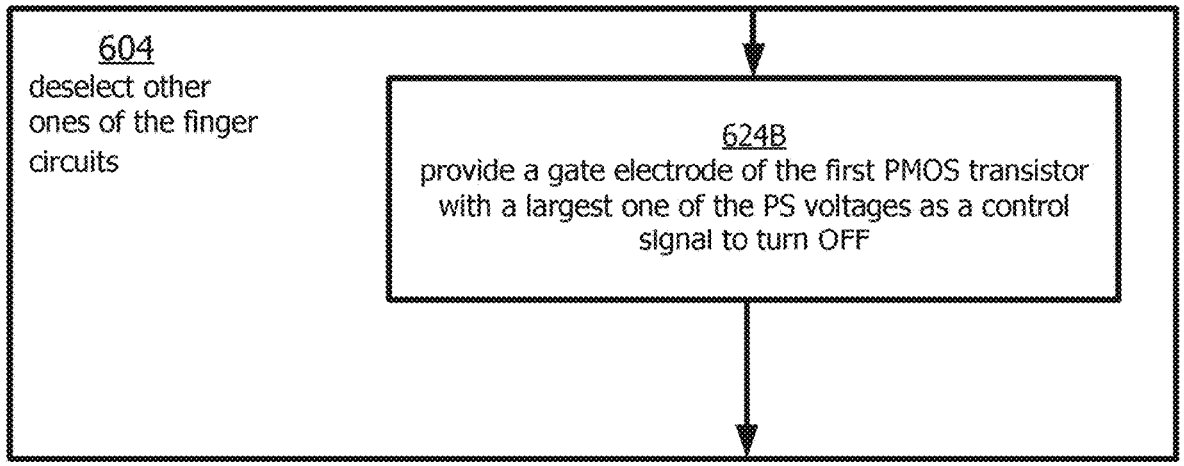
FIG. 6E is a flowchart describing a block 604 of FIG. 6A in more detail, in accordance with at least one embodiment of the present disclosure.

FIG. 6E is a flowchart describing block 604 of FIG. 6A in more detail, in accordance with at least one embodiment of the present disclosure.

In FIG. 6E, block 604 includes a block 624B. At block 624B, for each of the other ones of the finger circuits, a gate electrode of the first PMOS transistor is provided with a largest one of the PS voltages as a control signal to turn OFF.

Figure 6F:
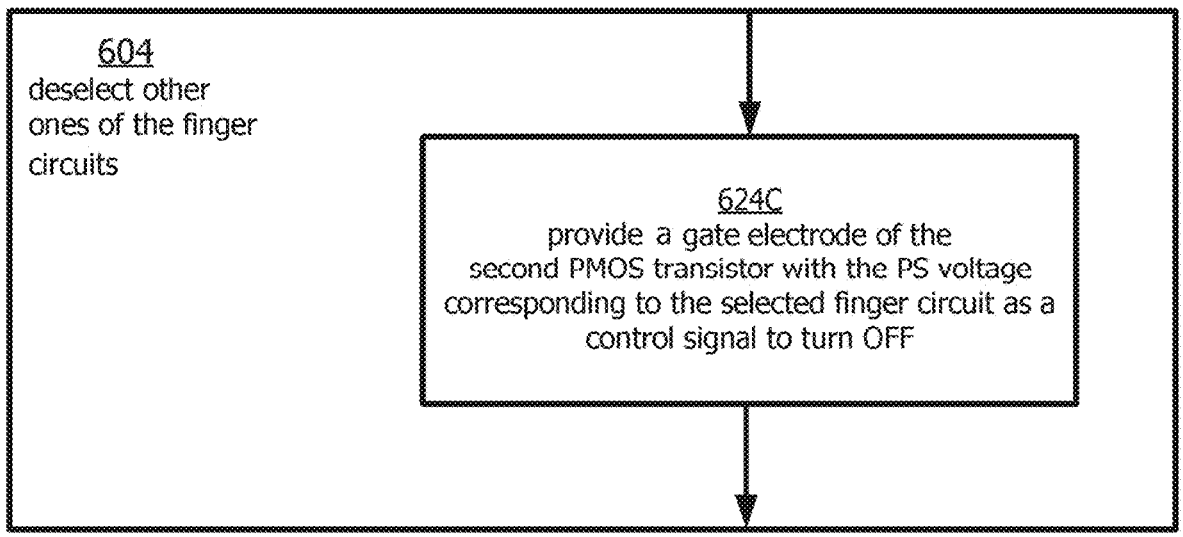
FIG. 6F is a flowchart describing a block of FIG. 6A in more detail, in accordance with at least one embodiment of the present disclosure.

FIG. 6F is a flowchart describing block 604 of FIG. 6A in more detail, in accordance with at least one embodiment of the present disclosure.

In FIG. 6F, block 604 includes a block 624C. At block 624C, for each of the other ones of the finger circuits, a gate electrode of the second PMOS transistor is provided with the PS voltage corresponding to the selected finger circuit as a control signal to turn OFF.

Figure 7A:
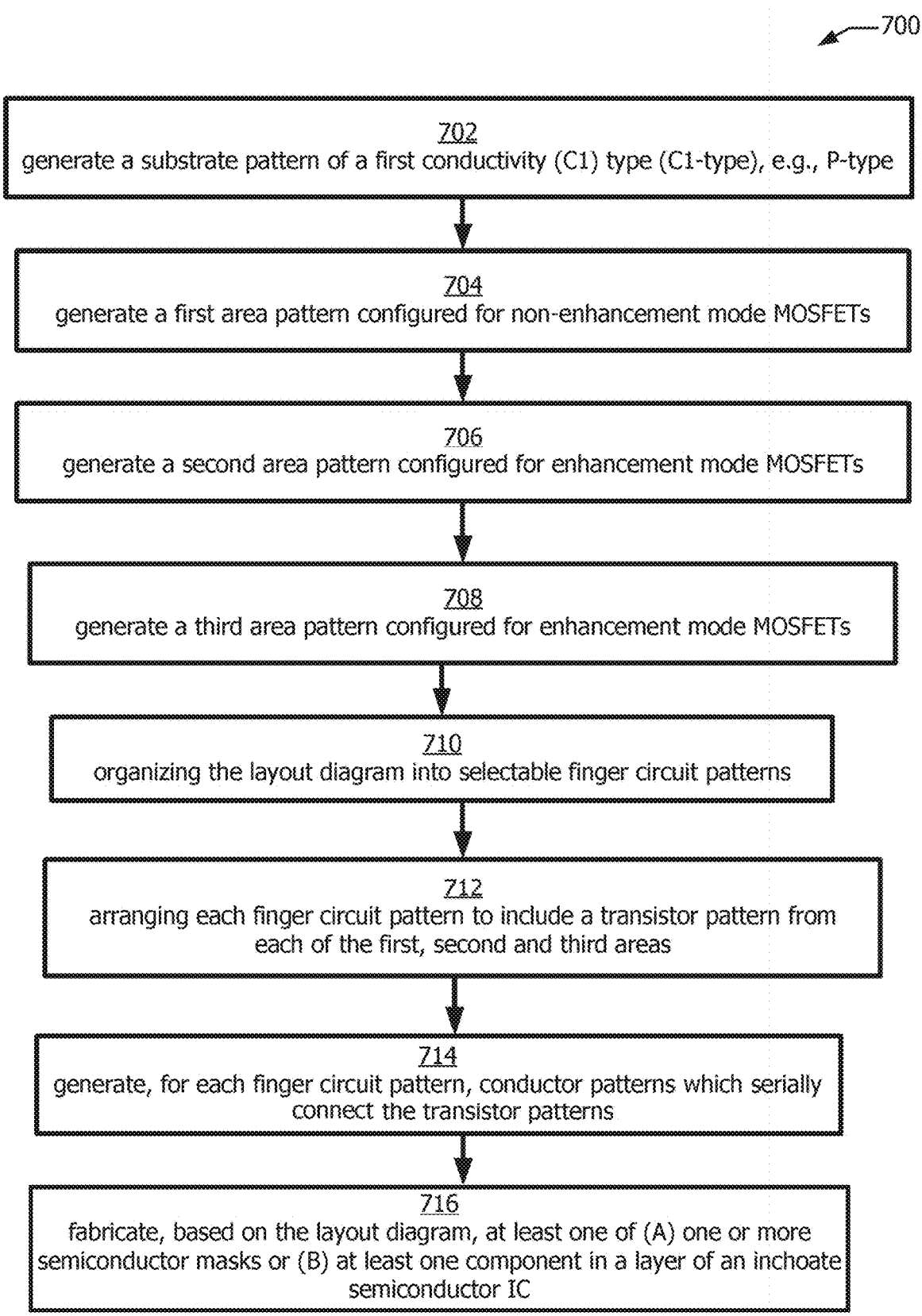
FIG. 7A is a flowchart of a method of generating a layout diagram of a semiconductor device for multiplexing power supply (PS) voltages, in accordance with at least one embodiment of the present disclosure.

FIG. 7A is a flowchart of a method 700 of generating a layout diagram of a semiconductor device for multiplexing power supply (PS) voltages, in accordance with at least one embodiment of the present disclosure.

Examples of a layout diagram generated by method 700 include corresponding layout diagrams 402B1 (FIG. 4A) or 402B2 (FIG. 4B), or the like. Examples of multiplexer circuits resulting from a layout diagram generated by method 700 include multiplexer circuits 102 (FIG. 1), 202A (FIG. 2A), 202B (FIG. 2B), 302A (FIG. 3A), 302B (FIG. 3B) or 502B (FIG. 5), multiplexer circuits resulting from corresponding layout diagrams 402B1 (FIG. 4A) or 402B2 (FIG. 4B), or the like. Examples of the PS voltages include voltages VDD(0)-VDD(N−1) of FIGS. 2A and 3A, voltages VDD(0)-VDD(3) of FIGS. 2B, 3B and 5, or the like.

In FIG. 7A, method 700 includes blocks 702-714. At block 702, a substrate pattern of a first conductivity (C1) type (C1-type) is generated. An example of the substrate pattern is substrate pattern 420 of FIG. 4A, which has P-type conductivity. From block 702, flow proceeds to block 704. At block 704, a first area pattern is generated, with the first area pattern being configured for non-enhancement mode MOSFETs. An example of the first area pattern is anti-leak pattern 406B' of FIG. 4A, which is configured for native NMOS transistors. From block 704, flow proceeds to block 706. At block 706, a second area pattern is generated, with the second area pattern being configured for enhancement mode MOSFETs. An example of the second area pattern is selector pattern 408B' of FIG. 4A. From block 706, flow proceeds to a block 708. At block 708, a third area pattern is generated, with the third area pattern being configured for enhancement mode MOSFETs. An example of the third area pattern is driver pattern 410B' of FIG. 4A. From block 708, flow proceeds to block 710.

At block 710 of FIG. 7A, the layout diagram is organized into selectable finger circuit patterns. An example of the selectable finger circuit patterns are finger circuit patterns 404B(0)-404B(3) of FIG. 4A, or the like. From block 710, flow proceeds to block 712. At block 712, each finger circuit is arranged to include a transistor pattern from each of the first, second and third areas. From block 712, flow proceeds to block 714. At block 714, for each finger circuit patterns, conductor patterns are generated, wherein the conductor patterns serially connect the transistor patterns. Examples of the conductor patterns include conductor patterns 481A-481D, 482A-482D, 483A-483D and 484A-484D of FIG. 4A. From block 714, flow proceeds to block 716. At block 716, based on the layout diagram, at least one of (A) one or more semiconductor masks or (B) at least one component in a layer of an inchoate semiconductor integrated circuit is/are fabricated. An example of a facility to fabricate one or more semiconductor masks is mask house 930 of FIG. 9 (discussed below). An example of a facility to fabricate at least one component in a layer of an inchoate semiconductor integrated circuit (IC) is fab 940 of FIG. 9 (discussed below).

Figure 7B:
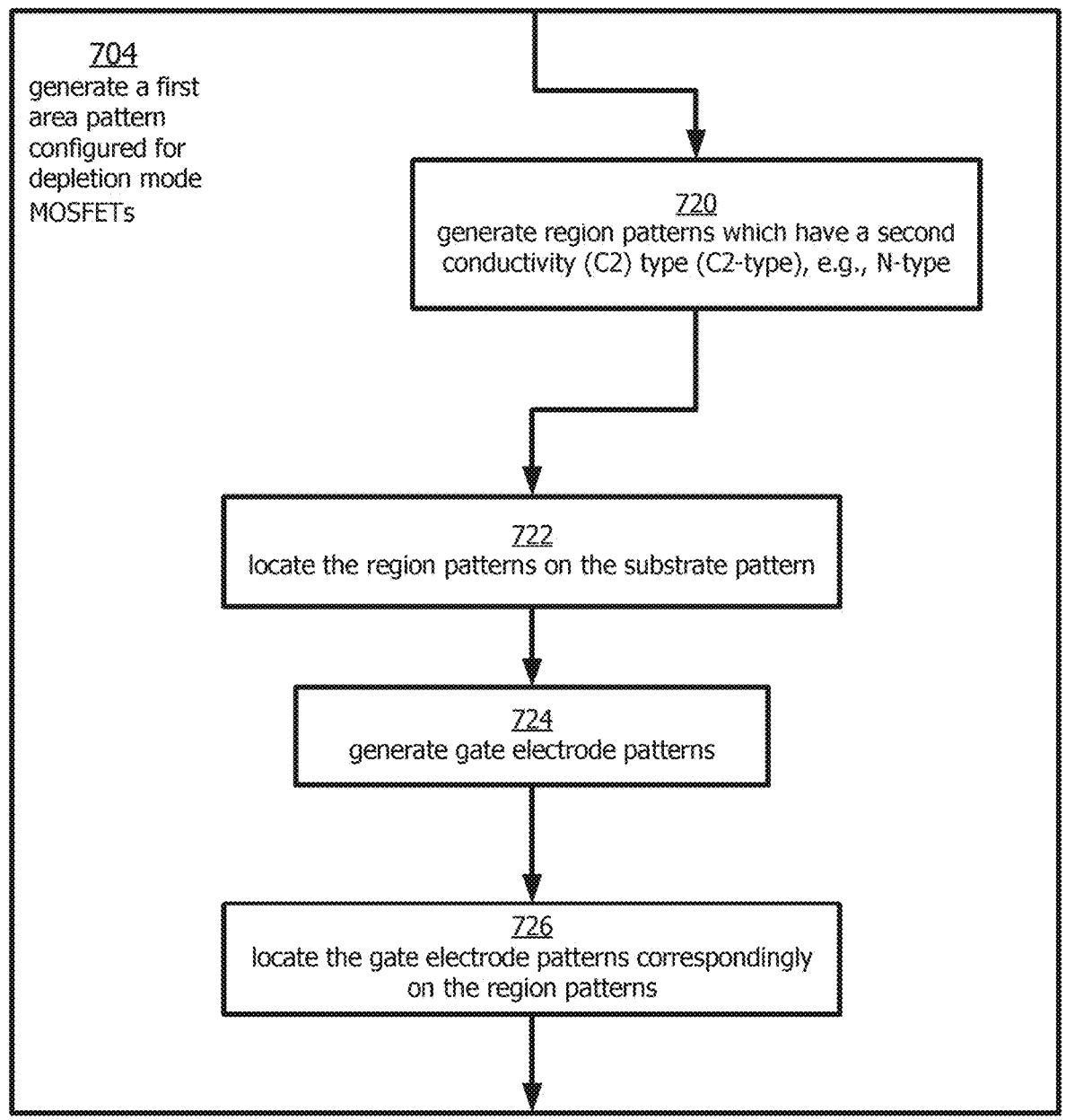
FIG. 7B is a flowchart describing block of FIG. 7A in more detail, in accordance with at least one embodiment of the present disclosure.

FIG. 7B is a flowchart describing block 704 of FIG. 7A in more detail, in accordance with at least one embodiment of the present disclosure.

In FIG. 7B, block 704 includes blocks 720-726. At block 722, region patterns are generated which have a second conductivity (C2) type (C2-type). An example of the region patterns are region patterns 422(1,1), 422(1,2), 422(1,3), 422(1,4)) of FIG. 4A, which are N+. From block 720, flow proceeds to block 722. At block 722, the region patterns are located on the substrate pattern. From block 722, flow proceeds to block 724. At block 724, gate electrode patterns are generated. Examples of the gate electrode patterns include gate electrode patterns 424(1,1)-424(1,4) of FIG. 4A. From block 724, flow proceeds to block 726. At block 726, the gate electrode patterns are located correspondingly on the first region patterns so as to define corresponding C2-type transistor patterns.

Figure 7C:
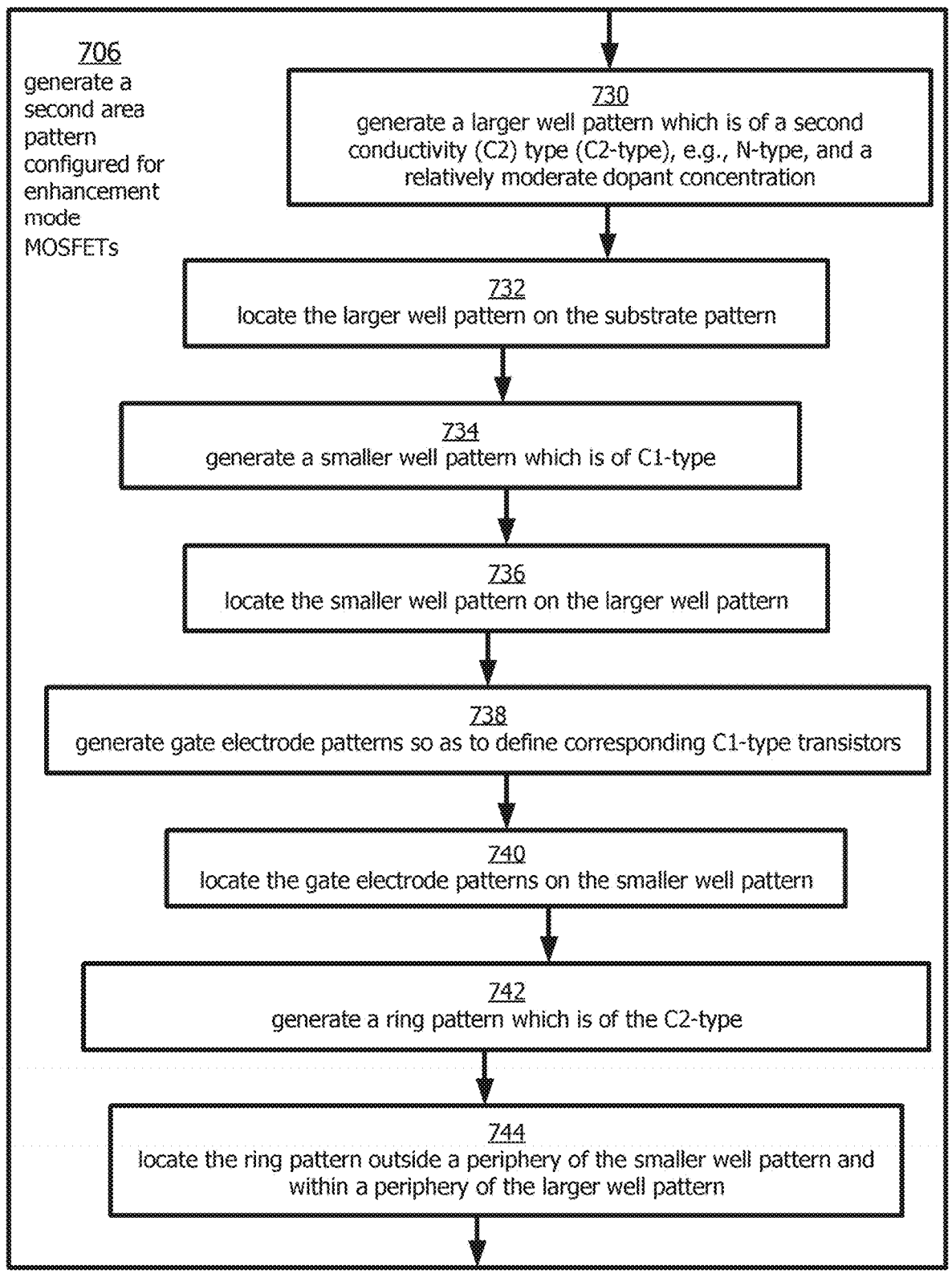
FIG. 7C is a flowchart describing block of FIG. 7A in more detail, in accordance with at least one embodiment of the present disclosure.

FIG. 7C is a flowchart describing block 706 of FIG. 7A in more detail, in accordance with at least one embodiment of the present disclosure.

In FIG. 7C, block 706 includes blocks 730-744. At block 730, a larger well pattern is generated which is of the C2-type. An example of the larger well pattern is larger well pattern 441 of FIG. 4A, which as N-type conductivity. From block 706, flow proceeds to block 732. At block 732, the larger well pattern is located on the substrate pattern. From block 732, flow proceeds to block 734. At block 734, a smaller well pattern is generated which is of the C1-type. An example of the smaller well pattern is smaller well pattern 442 of FIG. 4A, which has P-type conductivity and is P+. From block 734, flow proceeds to block 736. At block 736, the smaller well pattern is located on the larger well pattern. From block 736, flow proceeds to block 738.

At block 738, gate electrode patterns are generated so as to define corresponding C1-type transistors. Examples of the gate electrode patterns include gate electrode patterns 444(1,1)-444(1,4) of FIG. 4A. From block 738, flow proceeds to block 740. At block 740, the gate electrode patterns are located on the smaller well pattern. From block 740, flow proceeds to block 742. At block 742, a ring pattern is generated which is of the C2-type. An example of the ring pattern is ring pattern 452 in area 408B' of FIG. 4A, which has N-type conductivity and is N+. From block 742, flow proceeds to block 744. At block 744, the ring pattern is located outside a periphery of the smaller well pattern and within a periphery of the larger well pattern.

While FIG. 7C is a flowchart describing block 706 of FIG. 7A in more detail, FIG. 7C is easily adapted as FIG. 7C' (not shown) to describe block 708 in more detail, in accordance with at least one embodiment of the present disclosure. Blocks 730-744 of FIG. 7C are included in FIG. 7C'. Different examples are used for blocks 730-744 in the context of FIG. 7C' than are used in the context of FIG. 7C.

Examples in the context of FIG. 7C' (again not shown) include the following. In the context of block 730 of FIG. 7C', an example of the larger well pattern is larger well pattern 461 of FIG. 4A, which as N-type conductivity. In the context of block 734 of FIG. 7C', an example of the smaller well pattern is smaller well pattern 462 of FIG. 4A, which has P-type conductivity and is P+. In the context of block 738 of FIG. 7C', examples of the gate electrode patterns include gate electrode patterns 464(1,1)-464(1,4) of FIG. 4A. In the context of block 742 of FIG. 7C', an example of the ring pattern is ring pattern 472 in area 408B' of FIG. 4A, which has N-type conductivity and is N+.

Figure 7D:
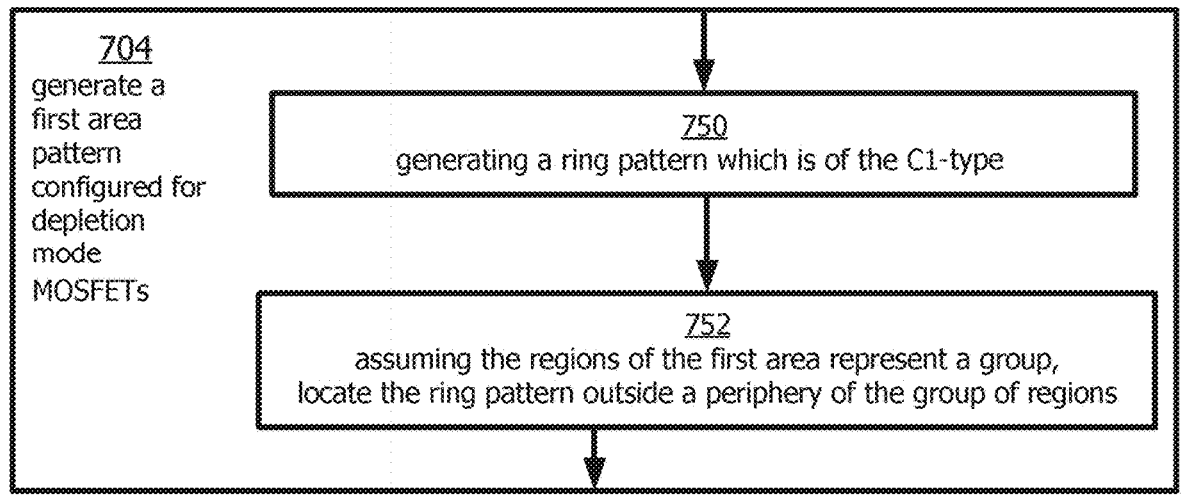
FIG. 7D is a flowchart describing block of FIG. 7A in more detail, in accordance with at least one embodiment of the present disclosure.

FIG. 7D is a flowchart describing block 704 of FIG. 7A in more detail, in accordance with at least one embodiment of the present disclosure.

In FIG. 7D, block 704 includes blocks 750-752. At block 750, a ring pattern is generated which is of the C1-type. An example of the ring pattern is ring pattern 430(1) in area 406B' of FIG. 4A, which has P-type conductivity and is P+. From block 750, flow proceeds to block 752. At block 752, assuming the regions of the first area represent a group, the ring pattern is located outside a periphery of the group of regions.

Figure 7E:
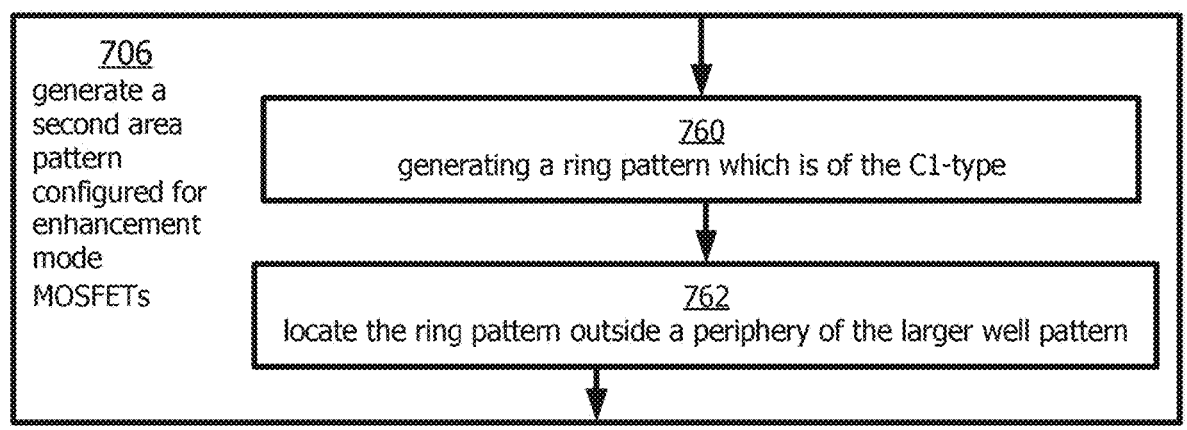
FIG. 7E is a flowchart describing block of FIG. 7A in more detail, in accordance with at least one embodiment of the present disclosure.

FIG. 7E is a flowchart describing block 706 of FIG. 7A in more detail, in accordance with at least one embodiment of the present disclosure.

In FIG. 7E, block 706 includes blocks 760-762. At block 760, a ring pattern is generated which is of the C1-type. An example of the ring pattern is ring pattern 430(2) in area 408B' of FIG. 4A, which has P-type conductivity and is P+. From block 760, flow proceeds to block 762. At block 762, the ring pattern is located outside a periphery of the larger well pattern.

While FIG. 7E is a flowchart describing block 706 of FIG. 7A in more detail, FIG. 7E is easily adapted as FIG. 7E' (not shown) to describe block 708 in more detail, in accordance with at least one embodiment of the present disclosure. Blocks 760-762 of FIG. 7E are included in FIG. 7E'. A different example is used for blocks 760-762 in the context of FIG. 7E' than is used in the context of FIG. 7E. In the context of block 706 of FIG. 7E', an example of the ring pattern is ring pattern 430(3) in area 410B' of FIG. 4A, which has P-type conductivity and is P+.

Figure 8:
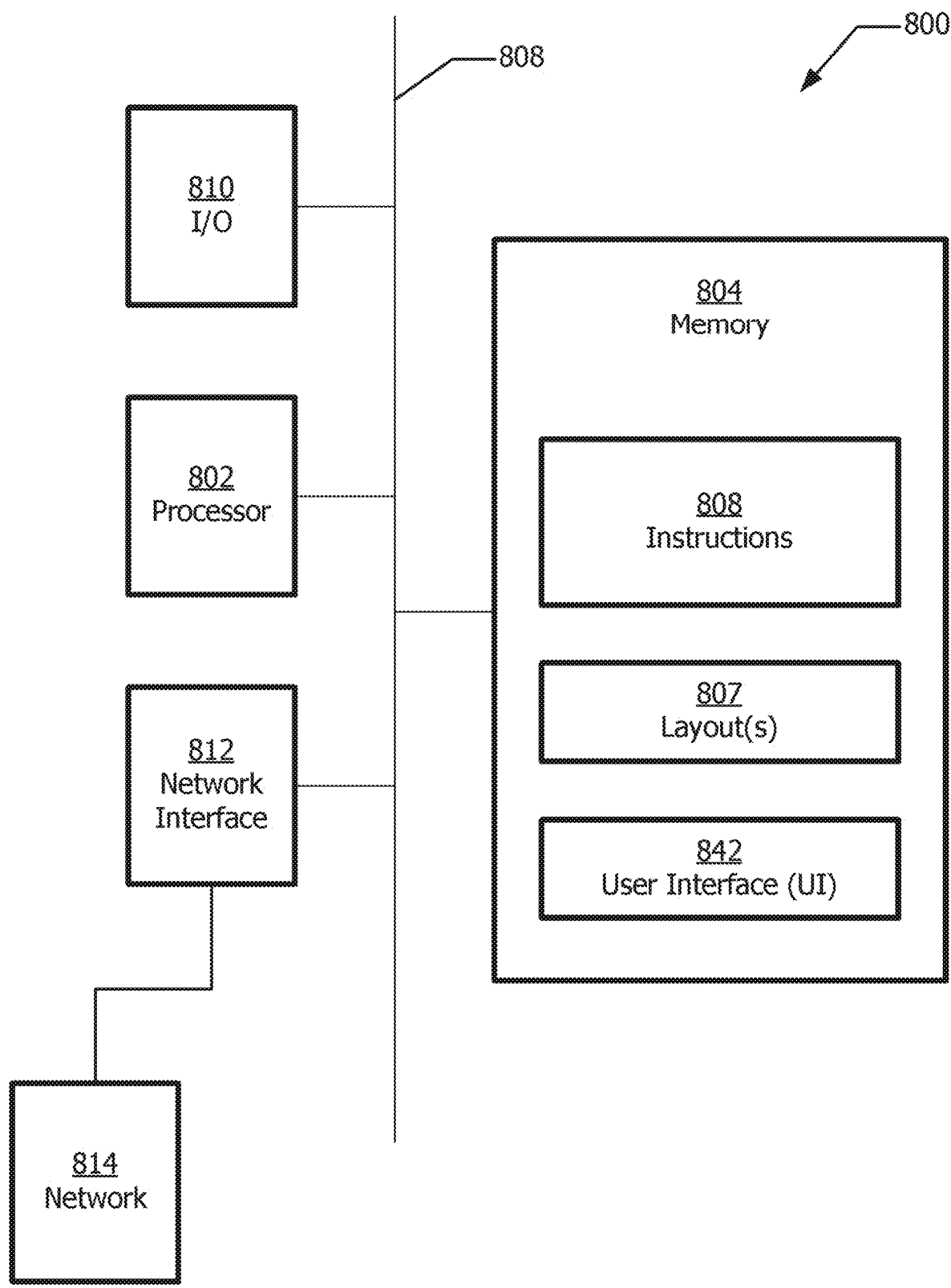
FIG. 8 is a block diagram of an electronic design automation (EDA) system, in accordance with at least one embodiment of the present disclosure.

FIG. 8 is a block diagram of an electronic design automation (EDA) system 800, in accordance with at least one embodiment of the present disclosure.

In some embodiments, EDA system 800 includes an automatic placement and routing (APR) system. The method of the flowchart of FIG. 4 is implemented, for example, using EDA system 800, in accordance with some embodiments.

In some embodiments, EDA system 800 is a general purpose computing device including a hardware processor 802 and a non-transitory, computer-readable storage medium 804. Storage medium 804, amongst other things, is encoded with, i.e., stores, computer program code 806, i.e., a set of executable instructions. Execution of instructions 806 by hardware processor 802 represents (at least in part) an EDA tool which implements a portion or all of, e.g., the method of FIG. 4, in accordance with one or more embodiments (hereinafter, the noted process and/or method).

Processor 802 is electrically coupled to computer-readable storage medium 804 via a bus 808. Processor 802 is also electrically coupled to an I/O interface 810 by bus 808. A network interface 812 is also electrically connected to processor 802 via bus 808. Network interface 812 is connected to a network 814, so that processor 802 and computer-readable storage medium 804 are capable of connecting to external elements via network 814. Processor 802 is configured to execute computer program code 806 encoded in computer-readable storage medium 804 in order to cause system 800 to be usable for performing a portion or all of the noted process and/or method. Computer-readable storage medium 804 also includes one or more layout diagrams 807 generated according to a portion or all of the noted process and/or method. In one or more embodiments, processor 802 is a central processing unit (CPU), a multi-processor, a distributed processing system, an application specific integrated circuit (ASIC), and/or a suitable processing unit.

In one or more embodiments, computer-readable storage medium 804 is an electronic, magnetic, optical, electromagnetic, infrared, and/or a semiconductor system (or apparatus or device). For example, computer-readable storage medium 804 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 804 includes a compact disk-read only memory (CD-ROM), a compact disk-read/write (CD-R/W), and/or a digital video disc (DVD).

In one or more embodiments, storage medium 804 stores computer program code 806 configured to cause system 800 (where such execution represents (at least in part) the EDA tool) to be usable for performing a portion or all of the noted process and/or method. In one or more embodiments, storage medium 804 also stores information which facilitates performing a portion or all of the noted process and/or method. In one or more embodiments, storage medium 804 stores a library (not shown) of standard cells.

EDA system 800 includes I/O interface 810. I/O interface 810 is coupled to external circuitry. In one or more embodiments, I/O interface 810 includes a keyboard, keypad, mouse, trackball, trackpad, touchscreen, and/or cursor direction keys for communicating information and commands to processor 802.

Again, EDA system 800 includes network interface 812. Network interface 812 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted process and/or method, is implemented in two or more systems 800.

System 800 is configured to receive information through I/O interface 810. The information received through I/O interface 810 includes one or more of instructions, data, design rules, libraries of standard cells, and/or other parameters for processing by processor 802. The information is transferred to processor 802 via bus 808. EDA system 800 is configured to receive information related to a UI through I/O interface 810. The information is stored in computer-readable medium 804 as user interface (UI) 842.

In some embodiments, a portion or all of the noted process and/or method is implemented as a standalone software application for execution by a processor. In some embodiments, a portion or all of the noted process and/or method is implemented as a software application that is a part of an additional software application. In some embodiments, a portion or all of the noted process and/or method is implemented as a plug-in to a software application. In some embodiments, at least one of the noted process and/or method is implemented as a software application that is a portion of an EDA tool. In some embodiments, a portion or all of the noted process and/or method is implemented as a software application that is used by EDA system 800. In some embodiments, a layout diagram is generated using a tool such as VIRTUOSO® available from CADENCE DESIGN SYSTEMS, Inc., or another suitable layout diagram generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 9:
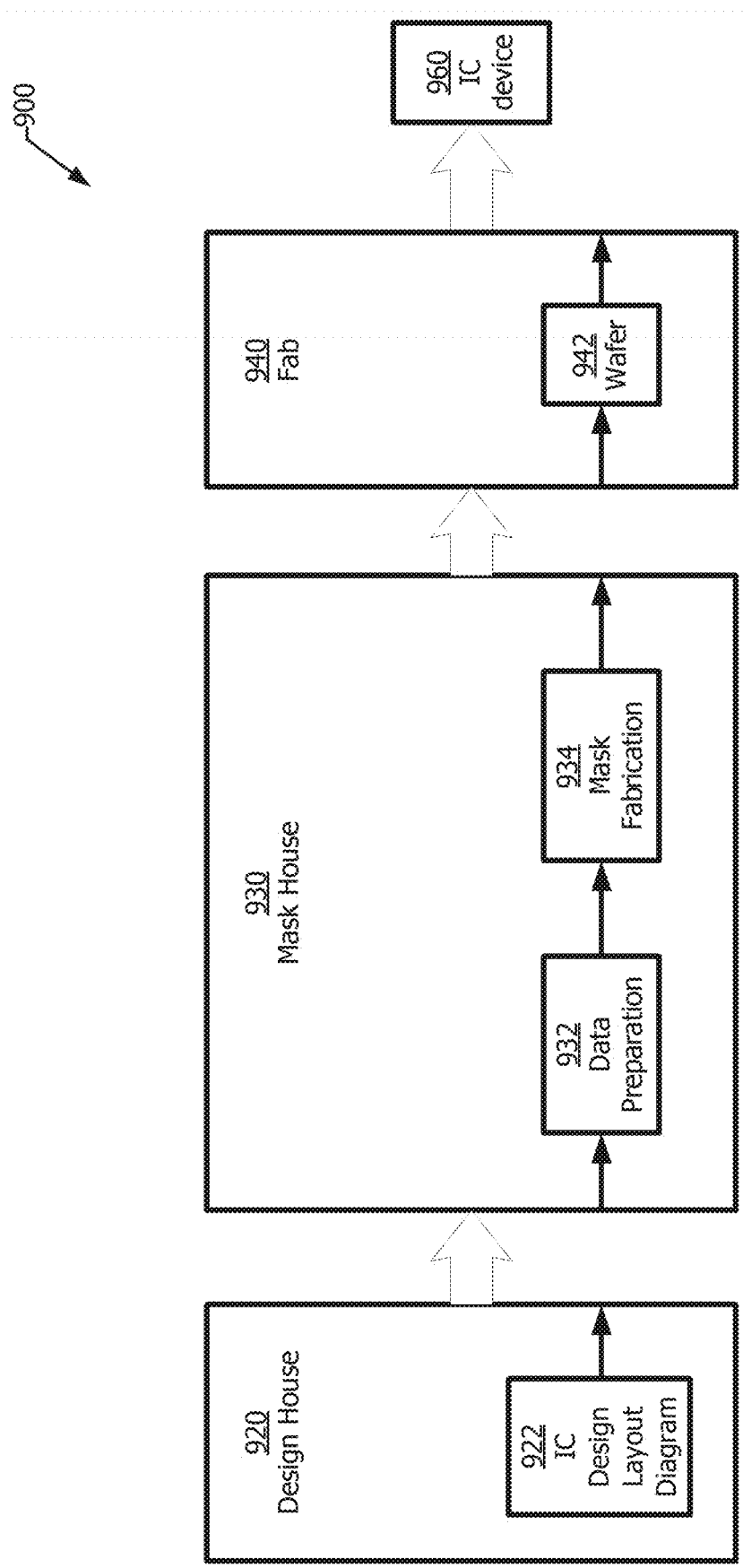
FIG. 9 is a block diagram of an integrated circuit (IC) manufacturing system, and an IC manufacturing flow associated therewith, in accordance with at least one embodiment of the present disclosure.

FIG. 9 is a block diagram of an integrated circuit (IC) manufacturing system 900, and an IC manufacturing flow associated therewith, in accordance with at least one embodiment of the present disclosure.

In FIG. 9, IC manufacturing system 900 includes entities, such as a design house 920, a mask house 930, and an IC manufacturer/fabricator ("fab") 940, that interact with one another in the design, development, and manufacturing cycles and/or services related to manufacturing an IC device 960. The entities in system 900 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 920, mask house 930, and IC fab 940 is owned by a single larger company. In some embodiments, two or more of design house 920, mask house 930, and IC fab 940 coexist in a common facility and use common resources.

Design house (or design team) 920 generates an IC design layout diagram 922. IC design layout diagram 922 includes various geometrical patterns designed for an IC device 960. The geometrical patterns correspond to patterns of metal, oxide, or semiconductor layers that make up the various components of IC device 960 to be fabricated. The various layers combine to form various IC features. For example, a portion of IC design layout diagram 922 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 920 implements a proper design procedure to form IC design layout diagram 922. The design procedure includes one or more of logic design, physical design or place and route. IC design layout diagram 922 is presented in one or more data files having information of the geometrical patterns. For example, IC design layout diagram 922 can be expressed in a GDSII file format or DFII file format.

Mask house 930 includes mask data preparation 932 and mask fabrication 934. Mask house 930 uses IC design layout diagram 922 to manufacture one or more masks to be used for fabricating the various layers of IC device 960 according to IC design layout diagram 922. Mask house 930 performs mask data preparation 932, where IC design layout diagram 922 is translated into a representative data file ("RDF"). Mask data preparation 932 provides the RDF to mask fabrication 934. Mask fabrication 934 includes a mask writer. A mask writer converts the RDF to an image on a substrate, such as a mask (reticle) or a semiconductor wafer. The design layout diagram is manipulated by mask data preparation 932 to comply with particular characteristics of the mask writer and/or requirements of IC fab 940. In FIG. 9, mask data preparation 932 and mask fabrication 934 are illustrated as separate elements. In some embodiments, mask data preparation 932 and mask fabrication 934 can be collectively referred to as mask data preparation.

In some embodiments, mask data preparation 932 includes optical proximity correction (OPC) which uses lithography enhancement techniques to compensate for image errors, such as those that can arise from diffraction, interference, other process effects and the like. OPC adjusts IC design layout diagram 922. In some embodiments, mask data preparation 932 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 932 includes a mask rule checker (MRC) that checks the IC design layout diagram that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram to compensate for limitations during mask fabrication 934, which may undo part of the modifications performed by OPC in order to meet mask creation rules.

In some embodiments, mask data preparation 932 includes lithography process checking (LPC) that simulates processing that will be implemented by IC fab 940 to fabricate IC device 960. LPC simulates this processing based on IC design layout diagram 922 to create a simulated manufactured device, such as IC device 960. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 922.

It should be understood that the above description of mask data preparation 932 has been simplified for the purposes of clarity. In some embodiments, mask data preparation 932 includes additional features such as a logic operation (LOP) to modify the IC design layout diagram according to manufacturing rules. Additionally, the processes applied to IC design layout diagram 922 during mask data preparation 932 may be executed in a variety of different orders.

After mask data preparation 932 and during mask fabrication 934, a mask or a group of masks are fabricated based on the modified IC design layout. In some embodiments, an electron-beam (e-beam) or a mechanism of multiple e-beams is used to form a pattern on a mask (photomask or reticle) based on the modified IC design layout. The mask can be formed in various technologies. In some embodiments, the mask is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask can be attenuated PSM or alternating PSM. The mask(s) generated by mask fabrication 934 is used in a variety of processes. For example, such a mask(s) is used in an ion implantation process to form various doped regions in the semiconductor wafer, in an etching process to form various etching regions in the semiconductor wafer, and/or in other suitable processes.

IC fab 940 is an IC fabrication business that includes one or more manufacturing facilities for the fabrication of a variety of different IC products. In some embodiments, IC Fab 940 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 940 uses the mask (or masks) fabricated by mask house 930 to fabricate IC device 960. Thus, IC fab 940 at least indirectly uses IC design layout diagram 922 to fabricate IC device 960. In some embodiments, a semiconductor wafer 942 is fabricated by IC fab 940 using the mask (or masks) to form IC device 960. Semiconductor wafer 942 includes a silicon substrate or other proper substrate having material layers formed thereon. Semiconductor wafer further includes one or more of various doped regions, dielectric features, multilevel interconnects, and the like (formed at subsequent manufacturing steps).

Details regarding an integrated circuit (IC) manufacturing system (e.g., system 900 of FIG. 9), and an IC manufacturing flow associated therewith are found, e.g., in U.S. Pat. No. 9,256,709, granted Feb. 9, 2016, U.S. Pre-Grant Publication No. 201502128429, published Oct. 1, 2015, U.S. Pre-Grant Publication No. 20140040838, published Feb. 6, 2014, and U.S. Pat. No. 7,260,448, granted Aug. 21, 20012, the entireties of each of which are hereby incorporated by reference.

In an embodiment, a multiplexer circuit, of power supply (PS) voltages, includes: finger circuits correspond to the PS voltages, each selectable finger circuit (A) having an input node which is finger-circuit-specific and an output node which is common to the finger circuits, (B) including an anti-leak transistor of a first conductivity (C1) type, a selector transistor and a driver transistor transistors of a second conductivity (C2) type connected in series between the input node and the output node, and (C) being configured to receive a corresponding one of the PS voltages from the input node, and provide, if selected, a first version of the corresponding PS voltage to the output node. In an embodiment, each anti-leak transistor is a non-enhancement mode transistor; each a selector transistor is an enhancement-mode transistor; and each driver transistor is an enhancement-mode transistor. In an embodiment, the multiplexer circuit further includes: first and second C1-type wells; and wherein each selector transistor of each selectable finger circuit is formed in the first C1-type well, and each driver transistor of each selectable finger circuit is formed in the second C1-type well. In an embodiment, the multiplexer circuit further includes: a bias rail connected to each of the first and second C1-type wells; and wherein the bias rail is configured to receive a second version of the PS voltage corresponding to a selected one of the selectable finger circuits. In an embodiment, at least one of the following is true: the C1-type is N-type such that the anti-leak transistor of each selectable finger is an N-type transistor, and the anti-leak transistor of each selectable finger circuit is configured to receive a largest one of the PS voltages as a control signal to turn ON; the selector transistor of each selectable finger circuit is configured to receive a largest one of the PS voltages as a control signal to turn OFF; or the driver transistor of each selectable finger circuit is configured to receive a largest one of the PS voltages as a control signal to turn OFF. In an embodiment, each of the selectable finger circuits further includes: an isolator transistor connected between the output node and VSS. In an embodiment, each isolator transistor is an enhancement-mode transistor.

In an embodiment, a method (of generating a layout diagram of a semiconductor device for multiplexing power supply (PS) voltages, the layout diagram being stored on a non-transitory computer-readable medium) includes: generating a substrate pattern of a first conductivity (C1) type (C1-type); generating an anti-leak area (AL-area) pattern configured for non-enhancement mode MOSFETs, the generating a AL-area pattern including disposing region patterns, which are of a second conductivity (C2) type (C2-type), on the substrate pattern, disposing gate electrode patterns correspondingly on the region patterns so as to define corresponding C2-type transistor patterns, generating a selector area (S-area) pattern configured for enhancement mode MOSFETs, and generating a driver area (D-area) pattern configured for enhancement mode MOSFETs; each of the generating a S-area pattern and the generating a D-area pattern including disposing a larger well pattern, which is of the C2-type on the substrate pattern; disposing a smaller well pattern, which has the C1-type, on the larger well pattern; disposing gate electrode patterns on the smaller well pattern so as to define corresponding C1-type transistors; disposing a ring pattern, which is of the C2-type, outside a periphery of the smaller well pattern and within a periphery of the larger well pattern; organizing the layout diagram into selectable finger circuit patterns; arranging each finger circuit pattern to include a transistor pattern from each of the AL-area, S-area and D-area patterns; and generating conductor patterns, for each finger circuit pattern, which serially connecting the transistor patterns. In an embodiment, the method further includes: setting the C1-type to be P-type; and setting the C2-type to be N-type. In an embodiment, the generating a AL-area pattern further includes: configuring the AL-area pattern for native NMOS transistors. In an embodiment, the regions of the AL-area represent a group; and the generating a AL-area pattern further includes generating a ring pattern which is of the C1-type, and locating the ring pattern outside a periphery of the group of regions. In an embodiment, each of the generating a S-area pattern and the generating a D-area pattern further includes: generating a ring pattern which is of the C1-type; and locating the ring pattern outside the periphery of the larger well pattern. In an embodiment, the method further includes: fabricating, based on the layout diagram, at least one of (A) one or more semiconductor masks or (B) at least one component in a layer of a semiconductor integrated circuit.

In an embodiment, a system (for generating a layout diagram of a semiconductor device for multiplexing power supply (PS) voltages, the layout diagram being stored on a non-transitory computer-readable medium) includes at least one processor, and at least one memory including computer program code for one or more programs; and wherein the at least one memory, the computer program code and the at least one processor are configured to cause the system to execute at least as follows: generating a substrate pattern of a first conductivity (C1) type (C1-type); generating a first area pattern configured for non-enhancement mode MOSFETs, the generating a first area pattern including disposing region patterns, which are of a second conductivity (C2) type (C2-type), on the substrate pattern; disposing gate electrode patterns correspondingly on the region patterns so as to define corresponding C2-type transistor patterns; generating a second area pattern configured for enhancement mode MOSFETs; generating a third area pattern configured for enhancement mode MOSFETs, each of the generating a second area pattern and generating a third area pattern including disposing generating a larger well pattern, which is of the C2-type, the larger well pattern on the substrate pattern, disposing a smaller well pattern, which has the C1-type, on the larger well pattern, disposing gate electrode patterns on the smaller well pattern so as to define corresponding C1-type transistors; and disposing a ring pattern, which is of the C2-type, outside a periphery of the smaller well pattern and within a periphery of the larger well pattern; organizing the layout diagram into selectable finger circuit patterns; arranging each finger circuit pattern to include a transistor pattern from each of the first, second and third area patterns; and generating conductor patterns, for each finger circuit pattern, which serially connecting the transistor patterns. In an embodiment, the at least one memory, the computer program code and the at least one processor are further configured to cause the system to execute at least as follows: setting the C1-type to be P-type; and setting the C2-type to be N-type. In an embodiment, the generating a first area pattern further includes: configuring the first area pattern for native NMOS transistors. In an embodiment, the regions of the first area represent a group; and the generating a first area pattern further includes: generating a ring pattern which is of the C1-type; and locating the ring pattern outside a periphery of the group of regions. In an embodiment, each of the generating a second area pattern and the generating a third area pattern further includes: generating a ring pattern which is of the C1-type; and locating the ring pattern outside the periphery of the larger well pattern. In an embodiment, the system further includes: a masking facility configured to fabricate one or more semiconductor masks based on based on the layout diagram; or a fabricating facility configured to fabricate at least one component in a layer of a semiconductor integrated circuit based on the layout diagram. In an embodiment, the masking facility is further configured, as an aspect included in fabrication of the one or more semiconductor masks, to perform one or more lithographic exposures based on the layout diagram; or the fabricating facility is further configured, as an aspect included in fabrication of the at least one component in a layer of the semiconductor integrated circuit, to perform one or more lithographic exposures based on the layout diagram.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A multiplexer circuit of power supply (PS) voltages, the multiplexer circuit comprising:
    selectable finger circuits correspond to the PS voltages, each selectable finger circuit:
        having an input node which is finger-circuit-specific and an output node which is common to the selectable finger circuits;
        including an anti-leak transistor, a selector transistor and a driver transistor connected in series between the input node and the output node, the anti-leak transistor being of a first conductivity (C1) type, and the selector and driver transistors being of a second conductivity (C2) type; and
        being configured to:
            receive a corresponding one of the PS voltages from the input node; and
            provide, if selected, a first version of the corresponding one of the PS voltages to the output node.

2. The multiplexer circuit of claim 1, wherein:
    each anti-leak transistor is a non-enhancement mode transistor;
    each selector transistor is an enhancement-mode transistor; and
    each driver transistor is an enhancement-mode transistor.

3. The multiplexer circuit of claim 1, further comprising: first and second C1-type wells;
    wherein:
        each selector transistor of each selectable finger circuit is formed in the first C1-type well; and
        each driver transistor of each selectable finger circuit is formed in the second C1-type well.

4. The multiplexer circuit of claim 3, further comprising:
    a bias rail connected to each of the first and second C1-type wells; and
    wherein the bias rail is configured to receive a second version of the PS voltage corresponding to a selected one of the selectable finger circuits.

5. The multiplexer circuit of claim 3, wherein at least one of the following is true:
    each of the first and second C1-type wells is N-type such that the anti-leak transistor of each selectable finger circuit is an N-type transistor, and the anti-leak transistor of each selectable finger circuit is configured to receive a largest one of the PS voltages as a control signal to turn ON;
    the selector transistor of each selectable finger circuit is configured to receive a largest one of the PS voltages as a control signal to turn OFF; or
    the driver transistor of each selectable finger circuit is configured to receive a largest one of the PS voltages as a control signal to turn OFF.

6. The multiplexer circuit of claim 1, wherein:
    each of the selectable finger circuits further includes:
        an isolator transistor connected between the output node and VSS.

7. The multiplexer circuit of claim 6, wherein:
    each isolator transistor is an enhancement-mode transistor.

8. A method of generating a layout diagram of a semiconductor device for multiplexing power supply (PS) voltages, the layout diagram being stored on a non-transitory computer-readable medium, the method comprising:
    generating a substrate pattern of a first conductivity (C1) type (C1-type);
    generating an anti-leak area (AL-area) pattern configured for non-enhancement mode MOSFETs, the generating an AL-area pattern including:
        disposing region patterns, which are of a second conductivity (C2) type (C2-type), on the substrate pattern;
        disposing gate electrode patterns correspondingly on the region patterns so as to define corresponding C2-type transistor patterns;
    generating a selector area (S-area) pattern configured for enhancement mode MOSFETs;
    generating a driver area (D-area) pattern configured for enhancement mode MOSFETs;
    each of the generating a S-area pattern and the generating a D-area pattern including:
        disposing a larger well pattern, which is of the C2-type, on the substrate pattern;
        disposing a smaller well pattern, which has the C1-type, on the larger well pattern;
        disposing gate electrode patterns on the smaller well pattern so as to define corresponding C1-type transistors; and
        disposing a ring pattern, which is of the C2-type, outside a periphery of the smaller well pattern and within a periphery of the larger well pattern;
    organizing the layout diagram into selectable finger circuit patterns;
    arranging each finger circuit pattern to include a transistor pattern from each of the AL-area, S-area and D-area patterns; and
    generating conductor patterns, for each finger circuit pattern, which serially connect the transistor patterns.

9. The method of claim 8, further comprising:
setting the C1-type to be P-type; and
setting the C2-type to be N-type.

10. The method of claim 9, wherein the generating an AL-area pattern further includes:
configuring the AL-area pattern for native NMOS transistors.

11. The method of claim 8, wherein:
the region patterns of the AL-area represent a group; and
the generating an AL-area pattern further includes:
generating a ring pattern which is of the C1-type; and
locating the ring pattern outside a periphery of the group of region patterns.

12. The method of claim 8, wherein each of the generating a S-area pattern and the generating a D-area pattern further includes:
generating a ring pattern which is of the C1-type; and
locating the ring pattern outside the periphery of the larger well pattern.

13. The method of claim 8, further comprising:
fabricating, based on the layout diagram, at least one of (A) one or more semiconductor masks or (B) at least one component in a layer of a semiconductor integrated circuit.

14. A system for generating a layout diagram of a semiconductor device for multiplexing power supply (PS) voltages, the layout diagram being stored on a non-transitory computer-readable medium, the system comprising:
at least one processor; and
at least one memory including computer program code for one or more programs; and
wherein the at least one memory, the computer program code and the at least one processor are configured to cause the system to execute at least as follows:
generating a substrate pattern of a first conductivity (C1) type (C1-type);
generating a first area pattern configured for non-enhancement mode MOSFETs, the generating a first area pattern including:
disposing region patterns, which are of a second conductivity (C2) type (C2-type), on the substrate pattern;
disposing gate electrode patterns correspondingly on the region patterns so as to define corresponding C2-type transistor patterns;
generating a second area pattern configured for enhancement mode MOSFETs;
generating a third area pattern configured for enhancement mode MOSFETs;
each of the generating a second area pattern and generating a third area pattern including:
disposing a larger well pattern, which is of the C2-type, on the substrate pattern;
disposing a smaller well pattern, which has the C1-type, on the larger well pattern;
disposing gate electrode patterns on the smaller well pattern so as to define corresponding C1-type transistors; and
disposing a ring pattern, which is of the C2-type, outside a periphery of the smaller well pattern and within a periphery of the larger well pattern;
organizing the layout diagram into selectable finger circuit patterns;
arranging each finger circuit pattern to include a transistor pattern from each of the first, second and third area patterns; and
generating conductor patterns, for each finger circuit pattern, which serially connect the transistor patterns.

15. The system of claim 14, the at least one memory, the computer program code and the at least one processor are further configured to cause the system to execute at least as follows:
setting the C1-type to be P-type; and
setting the C2-type to be N-type.

16. The system of claim 15, wherein the generating a first area pattern further includes:
configuring the first area pattern for native NMOS transistors.

17. The system of claim 14, wherein:
the region patterns of the first area pattern represent a group; and
the generating a first area pattern further includes:
generating a ring pattern which is of the C1-type; and
locating the ring pattern outside a periphery of the group of region patterns.

18. The system of claim 14, wherein each of the generating a second area pattern and the generating a third area pattern further includes:
generating a ring pattern which is of the C1-type; and
locating the ring pattern outside the periphery of the larger well pattern.

19. The system of claim 14, further comprising at least one of:
a masking facility configured to fabricate one or more semiconductor masks based on based on the layout diagram; or
a fabricating facility configured to fabricate at least one component in a layer of a semiconductor integrated circuit based on the layout diagram.

20. The system of claim 19, wherein:
the masking facility is further configured, as an aspect included in fabrication of the one or more semiconductor masks, to perform one or more lithographic exposures based on the layout diagram; or
the fabricating facility is further configured, as an aspect included in fabrication of the at least one component in a layer of the semiconductor integrated circuit, to perform one or more lithographic exposures based on the layout diagram.

* * * * *